(12) United States Patent
Fukunaga et al.

(10) Patent No.: US 9,017,822 B2
(45) Date of Patent: Apr. 28, 2015

(54) WIRING MEMBER, RESIN-COATED METAL PART AND RESIN-SEALED SEMICONDUCTOR DEVICE, AND MANUFACTURING METHOD FOR THE RESIN-COATED METAL PART AND THE RESIN-SEALED SEMICONDUCTOR DEVICE

(75) Inventors: Takahiro Fukunaga, Kyoto (JP); Ryoutarou Imura, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1271 days.

(21) Appl. No.: 11/713,099

(22) Filed: Mar. 2, 2007

(65) Prior Publication Data
US 2007/0212478 A1 Sep. 13, 2007

(30) Foreign Application Priority Data

Mar. 3, 2006 (JP) ................................. 2006-058457
Jul. 31, 2006 (JP) ................................. 2006-208763

(51) Int. Cl.
*H05K 3/00* (2006.01)
*H01L 23/28* (2006.01)
(Continued)

(52) U.S. Cl.
CPC ................ *H05K 3/389* (2013.01); *B29C 39/10* (2013.01); *B29L 2011/00* (2013.01); *B29L 2011/0083* (2013.01); *H01L 21/565* (2013.01); *H01L 23/3135* (2013.01); *H01L 23/49503* (2013.01); *H01L 23/49586* (2013.01); *H01L 33/52* (2013.01); *H01L 33/54* (2013.01); *H01L 33/56* (2013.01); *H01L 2224/48091* (2013.01);
(Continued)

(58) Field of Classification Search
None
See application file for complete search history.

(56) References Cited

U.S. PATENT DOCUMENTS 4,327,369 A * 4/1982 Kaplan ........................ 257/788
5,487,792 A * 1/1996 King et al. ................... 136/256
(Continued)

FOREIGN PATENT DOCUMENTS

JP 05-102374 A 4/1993
JP 05102374 A * 4/1993
(Continued)

OTHER PUBLICATIONS

International Search Report dated Sep. 22, 2008 issued in corresponding International Application No. PCT/JP2008/002258.
(Continued)

*Primary Examiner* — Monique Jackson
(74) *Attorney, Agent, or Firm* — McDermott Will & Emery LLP

(57) ABSTRACT

There is provided a semiconductor device that suppresses the occurrence of resin burrs and has favorable electrical connectivity and bond strength, and a manufacturing method for such semiconductor device. A resin-coated metal part is manufactured by forming an organic coating by depositing a material including functional organic molecules on a wiring lead composed of a metallic material. Each of the functional organic molecules includes a main chain, a first functional group having a metal bonding property, and a second functional group. The first functional group and the second functional group are provided at different ends of the main chain. Thereafter the functional organic molecules self-assemble by bonding of the first functional groups to metal atoms of the wiring lead. After performing the organic coating formation step, resin is adhered to a predetermined surface area of the wiring lead having the organic coating formed thereon.

6 Claims, 19 Drawing Sheets

(51) Int. Cl.
*H05K 3/38* (2006.01)
*B29C 39/10* (2006.01)
*H01L 21/56* (2006.01)
*H01L 23/31* (2006.01)
*H01L 23/495* (2006.01)
*H01L 23/00* (2006.01)
*B29L 11/00* (2006.01)
*H01L 33/52* (2010.01)
*H01L 33/54* (2010.01)
*H01L 33/56* (2010.01)
*H05K 3/28* (2006.01)

(52) U.S. Cl.
CPC ............ *H01L2224/48247* (2013.01); *H01L 2924/01003* (2013.01); *H01L 2924/01005* (2013.01); *H01L 2924/01011* (2013.01); *H01L 2924/01015* (2013.01); *H01L 2924/01027* (2013.01); *H01L 2924/01029* (2013.01); *H01L 2924/01046* (2013.01); *H01L 2924/01047* (2013.01); *H01L 2924/0105* (2013.01); *H01L 2924/01061* (2013.01); *H01L 2924/01078* (2013.01); *H01L 2924/01079* (2013.01); *H01L 2924/01082* (2013.01); *H01L 2924/14* (2013.01); *H01L 2924/1433* (2013.01); *H05K 3/28* (2013.01); H01L 24/32 (2013.01); *H01L 24/48* (2013.01); *H01L 2224/32245* (2013.01); *H01L 2224/73265* (2013.01); *H01L 2924/01006* (2013.01); *H01L 2924/01019* (2013.01); *H01L 2924/01033* (2013.01); *H01L 2924/01044* (2013.01); *H01L 2924/01045* (2013.01); H01L 24/29 (2013.01)

(56) References Cited

U.S. PATENT DOCUMENTS

| | | | |
|---|---|---|---|
| 5,885,753 A * | 3/1999 | Crooks et al. | 430/325 |
| 2003/0113229 A1 * | 6/2003 | Briones et al. | 422/57 |
| 2003/0207114 A1 | 11/2003 | Atzesdorfer et al. | |
| 2004/0146715 A1 * | 7/2004 | Guire et al. | 428/412 |
| 2004/0245518 A1 * | 12/2004 | Ramanath et al. | 257/9 |
| 2005/0271975 A1 * | 12/2005 | McGimpsey et al. | 430/270.1 |
| 2007/0212478 A1 | 9/2007 | Fukunaga et al. | |

FOREIGN PATENT DOCUMENTS

| | | | |
|---|---|---|---|
| JP | 06-350000 A | | 12/1994 |
| JP | 7-254622 | | 10/1995 |
| JP | 10-329461 | | 12/1998 |
| JP | 2001-144145 | | 5/2001 |
| JP | 2002-033345 | | 1/2002 |
| JP | 2002-353614 A | | 12/2002 |
| JP | 2004087889 A | * | 3/2004 |
| JP | 2004-200349 | | 7/2004 |
| JP | 2004200350 A | * | 7/2004 |
| JP | 2005-026425 | | 1/2005 |
| JP | 2006-080473 A | | 3/2006 |
| JP | 2007016105 A | * | 1/2007 |
| JP | 2007-194401 A | | 8/2007 |
| WO | WO 2006/064106 A1 | | 6/2006 |

OTHER PUBLICATIONS

Office Action mailed May 23, 2012 from the US Patent Office issued in related U.S. Appl. No. 12/672,876.

Japanese Office Action, issued in Japanese Patent Application No. 2006-208763, dated Feb. 14, 2012.

Thomas B. Peters, et al., Journal of Organometallic Chemistry, 641 (2002) 53-61.

Jefferson W. Tilley et al., Journal of Medicinal Chemistry, 1987, 30, 185-193.

* cited by examiner

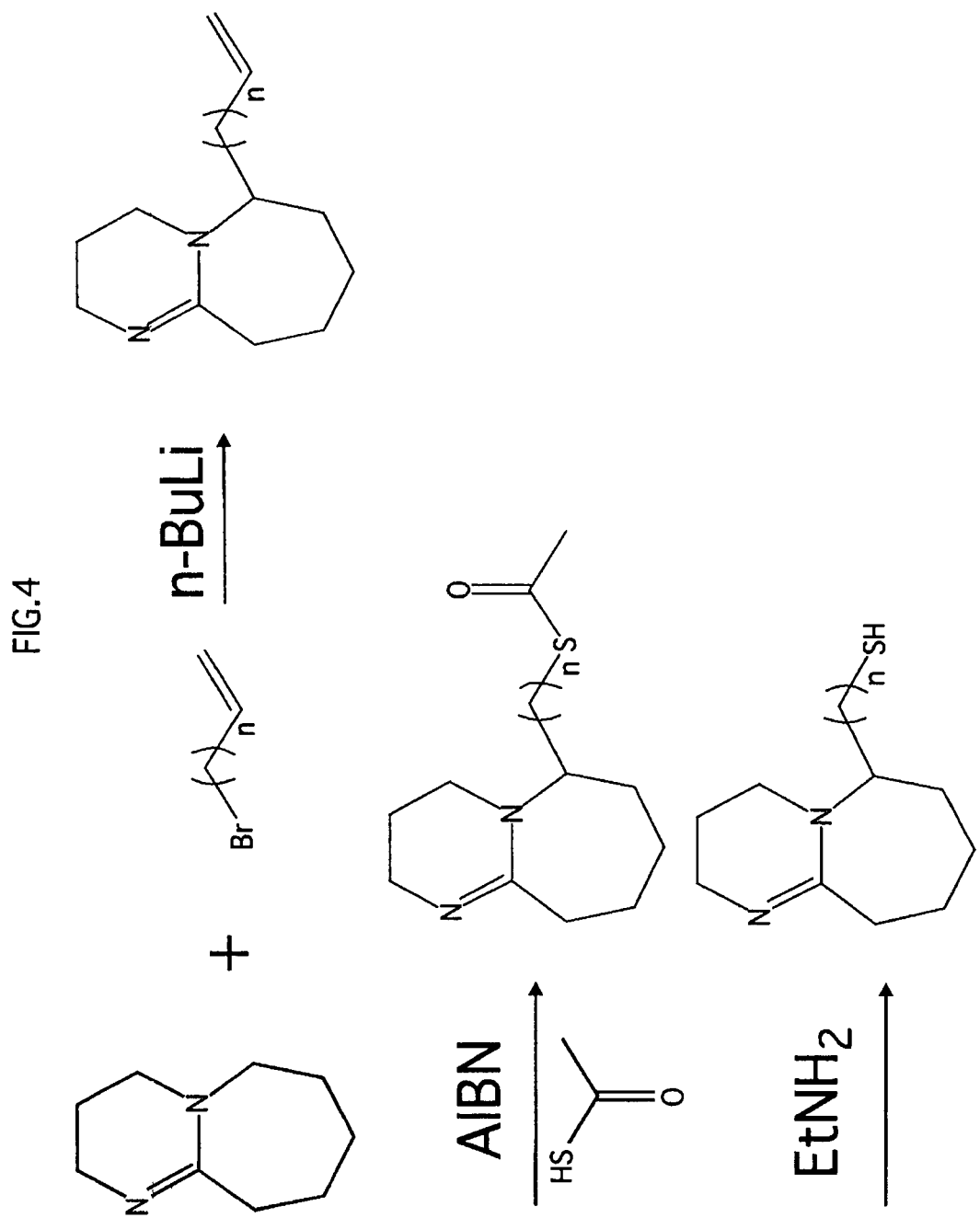

INJECTION OF RESIN

WIRING MEMBER, RESIN-COATED METAL PART AND RESIN-SEALED SEMICONDUCTOR DEVICE, AND MANUFACTURING METHOD FOR THE RESIN-COATED METAL PART AND THE RESIN-SEALED SEMICONDUCTOR DEVICE

BACKGROUND OF INVENTION

1. Field of the Invention

The present invention relates to a wiring member, a resin-coated-metal part and a resin-sealed semiconductor device, and a manufacturing method for the resin-coated metal part and the resin-sealed semiconductor device, and in particular to technology for improving adhesion between a metallic material and a resin material.

2. Related Art

Resin materials are widely used in semiconductor devices and wiring members.

In general, a semiconductor device such as an integrated circuit (IC) or large scale integrated circuit (LSI) are manufactured by a process in which a predetermined semiconductor element is connected to wiring leads by wire bonding etc., a portion of the wiring leads are exposed to the exterior, and packaging by resin sealing is performed by adhering resin to the wiring leads in this condition.

FIGS. 21A to 21D are schematic cross-sectional diagrams showing manufacturing steps for a resin-sealed QFP (Quad Flat Package) semiconductor device.

First, a semiconductor chip 94 is mounted on a die pad 93b of a wiring lead 93 (including die pads 93a and 93b), and the semiconductor chip 94 and the die pads 93a and 93b are connected by a wire 95.

Thereafter, the wiring lead 93 is disposed on a fixed die 92 (FIG. 21A).

Next, a movable die 91 is pressed on the fixed die 92 such that the dies 91 and 92 are closed together to form an inner space (cavity 97) therebetween. A thermoset resin is injected into the cavity 97 via a gate 96 provided in the movable die 91, thereby resin-sealing the semiconductor chip 94 etc. (FIG. 21B).

After hardening the thermoset resin, the dies 91 and 92 are opened, and an ejector pin (not depicted) is used to press out a resin cast 9z. Then outer leads 931a of the resin cast are bent, thereby obtaining a completed semiconductor device 9 (FIG. 21D).

The above were exemplary manufacturing steps for a QFP semiconductor device. There are other types of semiconductor devices, such as a light emitting diode (LED) device. An LED device is manufactured by, for example, forming a substrate in the interior of a mortar-shaped reflector such that a portion of a wiring lead is exposed, and mounting an LED element on the wiring lead in the reflector to connect the LED element and the wiring lead, and thereafter filling the interior of the reflector with a transparent sealing resin. In place of epoxy resin, silicone resin with a higher light transmittance is currently becoming more widely used.

Furthermore, film carrier tape, examples of which are TAB (Tape Automated Bonding) tape, T-BGA (Tape Ball Grid Array) tape, and ASIC (Application Specific Integrated Circuit) tape, and which is used in the implementation of electrical parts of the IC, LSI, etc., has a structure in which an insulating film composed of a polyimide etc., a wiring pattern layer composed of Cu, and a solder resist layer are laminated in the stated order. Here, resin materials are used as the insulating film and the solder resist layer.

Patent document 1: Japanese Laid-Open Patent No. 2731123
Patent document 2: Japanese Patent Application Publication No. H10-329461
Patent document 3: Japanese Patent Application Publication No. 2002-33345
Patent document 4: Japanese Patent No. 3076342

However, resin casts in semiconductor devices and LED devices, as well as film carrier tape have the following issues.

The first issue is a problem in which during the injection of the sealing resin, the resin not only fills the intended resin cast area, but also adheres to wiring lead areas that are not part of the intended resin cast area. As shown in the enlarged portion P of FIG. 21B in the manufacturing steps for the semiconductor device, there is the possibility that due to the injection of the resin material at a constant pressure, resin thin films (so called resin burrs) are formed on surfaces of the outer leads 931a of the wiring lead 93 when the resin material flows into gaps 900 between the dies (FIG. 21C). These gaps 900 occur due to imprecision between the dies 91 and 92, and the resin burrs 98a are formed due to the outflow of the resin material that occurs when the pressure during injection becomes directed into the gaps 900. The existence of the resin burrs 98a makes it possible for there to be problems with the connection strength and electric contact between the outer leads 931a and a substrate 99 in the next step. Although the dies 91 and 92 may be shaped with higher precision in order to prevent this problem, not only do costs rises significantly due to die designing, but also it is very difficult to completely prevent the occurrence of gaps due to problems with machine precision. Patent documents 1 to 3 for example propose measures for preventing gaps between the metal dies. However, the technology disclosed in patent documents 1 and 2 increases the pressure applied to the wiring lead of the dies, and therefore there is the danger of applying an excessive deforming stress to the wiring lead, and there is the fear of damaging the dies or the wiring lead. Patent document 3 discloses technology for improving closure of the dies by pre-adhering tape to portions of the dies where the gaps occur. However, even if such tape is used, there is the possibility of problems such as detachment of and damage to the tape in the injection step which involves mechanical frictional force under relatively high temperatures. Moreover, providing the tape still has problems with respect to a decrease in manufacturing efficiency and a rise in manufacturing costs.

Accordingly, assuming that the occurrence of resin burrs cannot be prevented, it becomes necessary to provide a step for eliminating the resin burrs 98a before the step for connection with the substrate. This also has problems with respect to a decrease in manufacturing efficiency and a rise in manufacturing costs.

The second issue is a problem when using silicone resin as the sealing resin in an LED device. Although able to maintain a high transparency, silicone resin has a higher linear expansion coefficient than epoxy resin etc. There is therefore the possibility that the silicone resin will heat-shrink due to thermal change (so-called thermal history) in the resin material in the step for injecting the silicone resin on the substrate. Accordingly, there is detachment between the silicone resin and the wiring lead, and there is the possibility of problems such as performance degradation due to poor contact, or insufficient contact strength.

Although there is also a technique of providing an Ag plating on surfaces of the wiring lead in order to improve luminous efficiency in an LED device, there is an issue regarding the Ag plating coat, which is mentioned here as the third issue. Although known to have a high reflection coefficient with respect to long wavelength visible light, Ag materials have a comparatively low reflection coefficient with respect to short wavelength light (approximately 500 nm or below). Accordingly, a sufficient reflection coefficient cannot be obtained when a blue, violet, ultraviolet, LED etc. is implemented in an LED device, in which case there is the possibility of not, obtaining an intended luminous efficiency.

The fourth issue is a problem in a case of, as shown in patent document 4, providing an Sn plating on the wiring pattern layer in the film carrier tape. An Sn coating layer is provided on the surface of the wiring pattern layer in order for connection with implementation parts by soldering. The ends of the solder resist layer peel due to the heated atmosphere in the plating step, and localized batteries are formed between an area under the peeled solder resist layer and another area on the surface of the wiring pattern layer due to the difference in ionization tendency of Sn ions and Cu ions (FIG. 22A). As a result of the formation of the localized batteries, erosion areas are formed due to Cu ions that have eluted into the surface of the wiring pattern layer. There is therefore the possibility of problems with respect to a reduction in the mechanical strength of the film carrier tape after the Sn plating has been performed, and with respect to the plating not being formed evenly.

As mentioned above, it can be said that there are still matters to be resolved when using resin materials in the fields of semiconductor devices and film carrier tape.

SUMMARY OF INVENTION

The present invention has been achieved in light of the above issues, and a first aim thereof is to provide a semiconductor device that suppresses the occurrence of resin burrs and has favorable electrical connectivity and bond strength, and a manufacturing method for such semiconductor device.

A second aim of the present invention is to, by improving adhesion between silicone resin and wiring leads, provide an LED device that can achieve favorable light emitting properties and a manufacturing method for such LED device.

A third aim of the present invention is to provide an LED device that can present superior luminous efficiency by the provision of a sufficient reflection coefficient even when emitting relatively short wavelength light, and a manufacturing method for such LED device.

A fourth aim of the present invention is to provide a film carrier tape that has superior Sn plating layer formation, mechanical strength, and connectivity, and a manufacturing method for such film carrier tape that can avoid damage to the wiring pattern layer during an Sn plating step while maintaining favorable manufacturing efficiency.

In order to solve the aforementioned problems, the present invention is a manufacturing method for a resin-coated metal part, including the steps of: forming an organic coating by depositing a material including a plurality of functional organic molecules on a wiring lead composed of a metallic material, each of the functional organic molecules including a main chain, a first functional group having a metal bonding property, and a second functional group, the first functional group and the second functional group each being provided at a different end of the main chain, and causing the plurality of functional organic molecules to self-assemble by bonding of the first functional groups to metal atoms of the wiring lead; and after performing the organic coating formation step, adhering a resin to a predetermined surface area of the wiring lead having the organic coating formed thereon.

Here, the main chain may be composed of at least one selected from the group consisting of a methylene chain, a fluoromethylene chain, and a siloxane chain, and the first functional group may be composed of a compound, a chemical structures or a derivative that includes at least one selected from the group consisting of a thiol compound, a sulfide compound, and a nitrogen-containing heterocyclic compound.

Also, the resin may be a thermoset resin. The thermoset resin may be composed of a compound, a chemical structure, or a derivative that includes at least one selected from the group consisting of an epoxy resin, a phenol resin, an acryl resin, a melamine resin, a urea resin, an unsaturated polyester resin, an alkyd resin, a polyimide resin, a polyamide resin, and a polyether resin, and the second functional group may be composed of a compound, a chemical structures or a derivative that includes at least one selected from the group consisting of a hydroxyl, a carboxylic acid, an acid anhydride, a primary amine, a secondary amine, a tertiary amine, an amide, a thiol, a sulfide, an imide, a hydrazide, an imidazole, a diazabicyclo-alkane, an organic phosphine, and a boron trifluoride amine complex.

Furthermore, in the organic coating formation step, the organic coating may be formed on a surface of the wiring lead that is greater in area than the predetermined surface area of the wiring lead where the resin is to be adhered in the resin adhering step.

The thermoset resin may be a silicone resin, and the second functional group may be composed of a compound, a chemical structure, or a derivative that includes at least one of a vinyl and an organic hydrogen silane.

Alternatively, the thermoset resin may be a silicone resin, and the second functional group may be composed of a compound, a chemical structure, or a derivative that includes at least one selected from the group consisting of platinum, palladium, ruthenium, and rhodium.

Also, the second functional group may be composed of a compound, a chemical structure, or a derivative that includes at least one of a fluorescent compound and a phosphorescent compound.

Furthermore, the organic coating formation step may include a dispersion fluid preparation substep of preparing an organic molecule dispersion fluid by dispersing the plurality of functional organic molecules in a solvent, and an immersion substep of immersing the wiring lead in the organic molecule dispersion fluid such that an immersed surface area of the wiring lead is greater in area than the predetermined surface area of the wiring lead where the resin is to be adhered.

Also, the present invention is a manufacturing method for the resin-coated metal part of the above-described invention, further including between the organic coating formation step and the resin adhering step, a step of electrically connecting the wiring lead to a semiconductor element, wherein the connecting step is performed between the organic coating formation step and the resin adhering step, and in the resin adhering step, the resin is adhered so as to encapsulate the semiconductor element, and such that a portion of the wiring lead is externally exposed.

Also, the present invention is a wiring member including a wiring lead composed of a metallic material, wherein an organic coating has been formed on a surface of the wiring lead by self-assembly of a plurality of functional organic molecules, each of the functional organic molecules has a chemical structure including a main chain, a first functional group, and a second functional group, the first functional group and the second functional group each being provided at a different end of the main chain, the first functional group being in a form for bonding to the wiring lead by any one or more of a metal bond, a hydrogen bond, and a coordinate bond by a metal complex, and the second functional group having a resin hardening property or a resin-hardening promoting property, and each of the first functional groups has bonded to the wiring lead.

Here, the main chain may be composed of at least one selected from the group consisting of a methylene chain, a fluoromethylene chain, and a siloxane chain, and the first functional group may be composed of a compound, a chemical structure, or a derivative that includes at least one selected from the group consisting of a thiol compound, a sulfide compound, and a nitrogen-containing heterocyclic compound.

Also, the present invention is a resin-coated metal part including the wiring member of the above-described present invention having a resin material adhered to a portion thereof, wherein a deposited area of the organic coating is greater in area than a surface area of the wiring member where the resin has been adhered.

Here, the resin may be a thermoset resin. Also, the thermoset resin may be composed of a compound, a chemical structure, or a derivative that includes at least one selected from the group consisting of an epoxy resin, a phenol resin, an acryl resin, a melamine resin, a urea resin, an unsaturated polyester resin, an alkyd resin, a polyimide resin, a polyamide resin, and a polyether resin, and the second functional group may be composed of a compound, a chemical structure, or a derivative that includes at least one selected from the group consisting of a hydroxyl, a carboxylic acid, an acid anhydride, a primary amine, a secondary amine, a tertiary amine, an amide, a thiol, a sulfide, an imide, a hydrazide, an imidazole, a diazabicyclo-alkane, an organic phosphine, and a boron trifluoride amine complex.

Also, the thermoset resin may be a silicone resin, and the second functional group may be composed of a compound, a chemical structure, or a derivative that includes at least one of a vinyl and an organic hydrogen silane.

Alternatively, the thermoset resin may be a silicone resin, and the second functional group may be composed of a compound, a chemical structure, or a derivative that includes at least one selected from the group consisting of platinum, palladium, ruthenium, and rhodium.

Also, the second functional group may be composed of a compound, a chemical structure, or a derivative that includes at least one of a fluorescent compound and a phosphorescent compound.

Furthermore, the present invention is a resin-sealed semiconductor device including: a wiring member composed of a metallic material, an organic coating having been formed on a surface of the wiring lead by self-assembly of a plurality of functional organic molecules, each of the functional organic molecules having a chemical structure including a main chain, a first functional group, and a second functional group, the first functional group and the second functional group each being provided at a different end of the main chain, the first functional group being in a form for bonding to the wiring lead by any one or more of a metal bond, a hydrogen bond, and a coordinate bond by a metal complex, and the second functional group having a resin hardening property or a resin-hardening promoting property, and each of the first functional groups having bonded to the wiring lead; and a semiconductor element electrically connected to the wiring lead, wherein a portion of the wiring member is externally exposed, and the semiconductor element has been resin sealed in an area where the organic coating has been formed.

Also, the present invention is a manufacturing method for a film carrier tape, including the steps of: forming an organic coating by depositing a material including a plurality of functional organic molecules on a predetermined surface of a wiring pattern layer, each of the functional organic molecules including a main chain, a first functional group having a metal bonding property, and a second functional group, the first functional group and the second functional group each being provided at a different end of the main chain, and causing the plurality of functional organic molecules to self-assemble by bonding of the first functional groups to metal atoms of the wiring pattern layer; and forming a solder resist layer by applying a solder resist material on the organic coating, the solder resist material chemically bonding to the second functional group of each of the functional organic molecules.

Here, the second functional group may be a functional group or chemical structure having a resin hardening property and/or a photopolymerization initiating property in a case of chemical bonding with the solder resist material.

Also, a compound, chemical structure, or derivate including at least one of an acid anhydride and a primary amine compound may be used as the second functional group having the resin hardening property.

Furthermore, the second functional group having the photopolymerization initiating property may be composed of a compound, a chemical structure, or a derivate that includes at least one selected from the group consisting of a benzophenone, an acetophenone, an alkylphenone, a benzoin, an anthraquinone, a ketal, a thioxanthone, a coumarin, a triazine halide, an oxadiazole halide, an oxime ester, an acridine, an acridone, a fluorenone, a fluorane, an acylphosphine oxide, a metallocene, a polynuclear aromatic, a xanthene, a cyanine, a squalium, an acridone, a titanocene, and a tetra-alkyl thiuram sulfide, and in the solder resist layer formation step, the resist material may be caused to photopolymerize by applying the solder resist material to the organic coating while exciting the second functional group by light irradiation.

Also, in the organic coating formation step, the organic coating may be formed using the functional organic molecules whose second functional groups have a photopolymerization initiating property, and in the solder resist layer formation step, the solder resist layer may be formed in a predetermined pattern by, while the wiring pattern layer having the organic coating formed thereon has been immersed in a dispersion solution composed of dispersed photopolymerizing molecules, applying a predetermined pattern mask to the wiring pattern and irradiating light in the dispersion solution to cause a polymerization reaction with respect to the second functional groups.

Furthermore, the wiring pattern layer may be composed of a copper material, and the manufacturing method may further include, after the solder resist layer formation step, a step of forming an Sn plating layer on a predetermined surface of the wiring pattern layer, excluding an area where the solder resist layer has been formed.

Also, the present invention is a film carrier tape including a wiring patter layer that is composed of a metallic material and has an organic coating and a solder resist layer successively formed thereon, wherein the organic coating is formed by self-assembly of a plurality of functional organic molecules, each of the functional organic molecules includes a main chain, a first functional group, and a second functional group, the first functional group and the second functional group each being provided at a different end of the main chain, the first functional group having a metal bonding property for the wiring pattern layer, and the second functional group having a chemical bonding property for the solder resist layer, the first functional group has bonded to the wiring pattern layer, and the second functional group has bonded to the solder resist layer.

Here, the second functional group may be a functional group or chemical structure having a resin hardening property and/or a photopolymerization initiating property in a case of chemical bonding with the solder resist material.

Also, the second functional group may have a resin hardening property and be composed of a compound, chemical structure, or derivate including at least one of an acid anhydride and a primary amine compound.

Alternatively, the second functional group may have a photopolymerization initiating property and be composed of a compound, a chemical structure, or a derivate that includes at least one selected from the group consisting of a benzophenone, an acetophenone, an alkylphenone, a benzoin, an anthraquinone, a ketal, a thioxanthone, a coumarin, a triazine halide, an oxadiazole halide, an oxime ester, an acridine, an acridone, a fluorenone, a fluorane, an acylphosphine oxide, a metallocene, a polynuclear aromatic, a xanthene, a cyanine, a squalium, an acridone, a titanocene, and a tetra-alkyl thiuram sulfide.

In the present invention having the above structure, an organic coating formed by the self-assembly of functional organic molecules is provided on a surface of a wiring lead composed of a metallic material, thereby enabling various types of favorable chemical actions between the organic coating and the resin material that adheres thereto.

Specifically, by providing the first functional group that exhibits a metal bonding property at one end of a main chain of the functional organic molecule, the functional organic molecule self-assembles on the wiring lead surface with the second functional group facing away from the wiring lead surface, thereby forming the organic coating. Accordingly, giving the second functional group a resin hardening property, a resin-hardening promoting property, or the like, enables increasing the bonding force between the wiring lead surface and the organic coating that has adhered thereto, and speeding up the hardening of the resin material.

As a result, even if, for example, there is a gap between the dies during injection molding, the resin that fills the cavity can be effectively suppressed from leaking into the gap due to speedily hardening on the organic coating. As such, there is no need for an extra step of eliminating resin burrs after resin molding. The present invention can also be realized by only using the organic coating, and there is no need to modify existing injection molding apparatuses or add a separate apparatus. This enables the realization of a semiconductor device that has favorable electrical connectivity at low costs and with superior manufacturing efficiency.

Also, using a compound including a vinyl group, hydrogensilane, etc. as the second functional group when using silicone resin as the thermoset resin obtains a secure chemical bond between the organic coating and the silicone resin. Accordingly, forming an organic coating composed of such functional organic molecules on the wiring leads of an LED device enables suppressing the occurrence of problems such as cracks in and peeling of the silicon resin and the wiring lead, degradation in performance due to poor contact under high temperature, and insufficient bond strength, and also enables the realization of stable luminous efficiency in the LED device.

Furthermore, in the structure of the LED device, providing the surface of the wiring leads with an organic coating composed of functional organic molecules that include a platinum complex as the second functional group causes the silicone resin filled thereon to harden very quickly. Even if unnecessary gaps are formed between the reflector and the wiring leads, the present invention effectively prevents the silicone resin from flowing into the gaps.

Note that the silicone resin may also be a silicone resin-containing conductive paste (a die bonding agent such as an Ag paste). Performing die bonding using the aforementioned silicone resin-containing conductive paste enables securely bonding the semiconductor chip to the die pad in an LED device or the like, and enables the stabilization of electrical and thermal conductivity due to a lower degree of degradation than when using a conventional epoxy resin-containing conductive paste.

Also, in the LED device, providing the wiring leads with an organic coating composed of functional organic molecules that include a fluorescent or phosphorescent compound as the second functional group enables improving the reflection coefficient with respect to ultraviolet light or short wavelength visible light. This achieves overall favorable luminous efficiency for the device even when including an Ag plating coat which has a low reflection coefficient with respect to short wavelength light.

Also, in the film carrier tape, using functional organic molecules that include a first functional group having a metal bonding property for the wiring pattern layer and a second functional group having a bonding property for the solder resist layer enables maintaining a stable layer structure between the wiring pattern layer and the solder resist layer. This prevents the edges of the solder resist layer from peeling off of the wiring pattern layer in the Sn plating step during manufacturing, and enables the manufacture of a high quality film carrier tape by suppressing the occurrence of localized batteries. Furthermore, the effect of making the wiring pattern layer water-resistant can be achieved if the main chain, which occupies a large portion of the structure of the functional organic molecules in the organic coating formed on the wiring pattern layer, includes a hydrophobic hydrocarbon or fluorocarbon. This achieves the effect of suppressing migration and maintaining stable performance as a conducting part.

Note that in the present invention, the organic coating composed of a single-molecule film is formed by the self-assembly of functional organic molecules and has a highly superior bonding property for the wiring leads. While having a single-molecule thickness, the present invention satisfies the demand for enhancing corrosion resistance, rust resistance, and anti-insulating properties of the area of the wiring leads where the organic coating is formed, and furthermore is very space efficient in the device. There is also no need to remove the organic coating after its provision. With respect to such points regarding functionality and structure, the present invention is entirely different from general surface preparation agents, surface activating agents, coating materials, and the like.

BRIEF DESCRIPTION OF DRAWINGS

These and other objects, advantages, and features of the invention will become apparent from the following description thereof taken in conjunction with the accompanying drawings, which illustrate specific embodiments of the present invention.

In the drawings:

FIG. 4 shows a synthesis reaction process of the functional organic molecule having a second functional group with a resin-hardening promoting property, pertaining to embodiment 1;

DETAILED DESCRIPTION OF PREFERRED EMBODIMENTS

Embodiments of the present invention are described below with reference to the drawings.

It should be noted that the present invention is of course not limited to the following embodiments, and appropriate modifications can be made unless such modifications depart from the technical scope of the present invention.

Embodiment 1

1. Semiconductor Device Structure

Figure 1A:
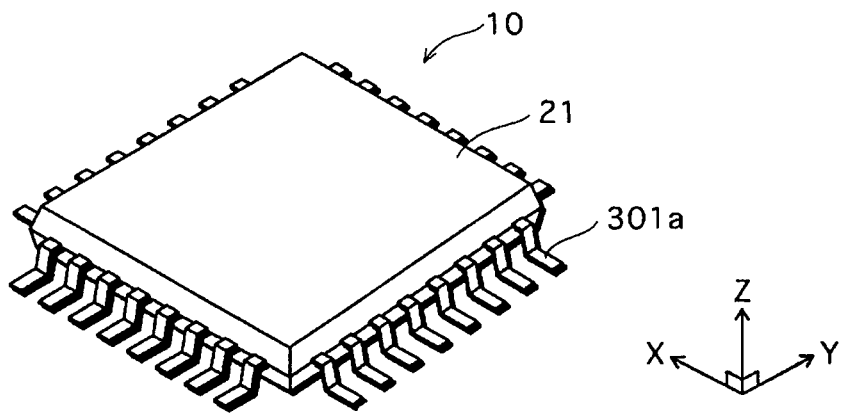
FIGS. 1A to 1C show a structure of a semiconductor device pertaining to embodiment 1.

FIG. 1A is an external perspective view showing a structure of a semiconductor device (QFP 10, Quad Flat Package), which is an exemplary application of the present invention.

Figure 1B:
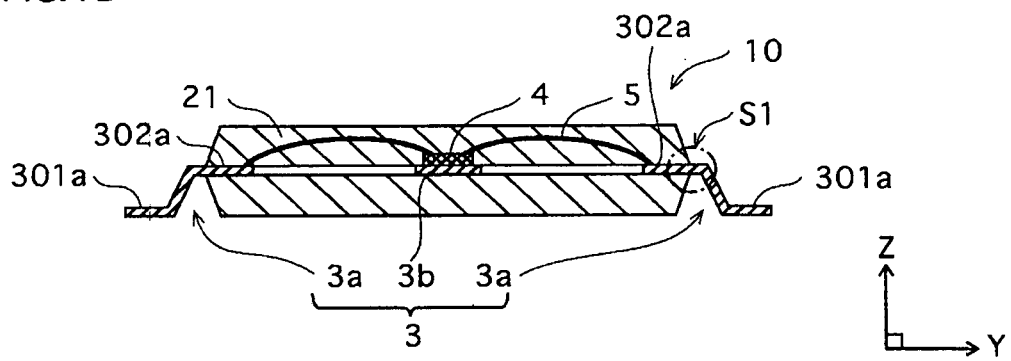
Figure 1C:
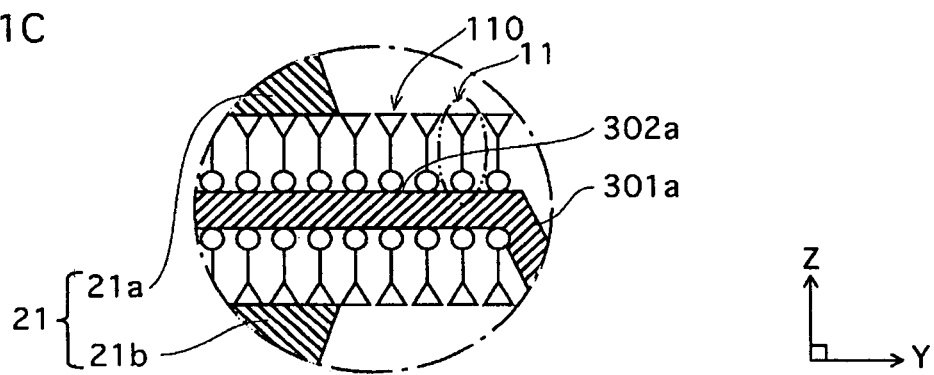

FIG. 1B is a y-z cross-sectional view of the QFP 10. FIG. 1C is an enlarged view of portion S1 in FIG. 1B.

The QFP 10 is a surface-mounted semiconductor device used in an IC, LSI etc., and is composed of a semiconductor chip 4, a wiring lead 3, wires 5, a molded resin 21, and the like.

The wiring lead 3 is constituted from a metallic material that has superior electrical conductivity (e.g., copper alloy), and has a structure that also includes die pads $3a$ and $3b$ that have been punched out of a metal plate.

As shown in FIG. 1A, the QFP 10 has a structure that includes the molded resin 21 formed in a board shape and having a predetermined thickness and square main surface, and outer leads $301a$ that are a part of the die pads $3a$ and extend out from a circumference of the molded resin 21.

As shown in FIG. 1B, the molded resin 21 has an internal structure in which the semiconductor chip 4 has been mounted on the die pad 3 and electrically connected to the die pads $3a$ and $3b$ via the wires 5 and electrode pads which are not depicted. Although not depicted, the die pad $3b$ and the semiconductor chip 4 are joined by an electrically conductive paste such as silver paste. An inner lead $302a$ is an area of each of the die pads $3a$ that is sealed in the molded resin 21, and an outer lead $301a$ is an area of each of the die pads $3a$ that is exposed to the exterior. Each of the outer leads $301a$ has been bent into an S shape with respect to a cross-sectional structure thereof.

Here, a characteristic feature of the QFP 10 is that an organic coating 110 formed by self-assembling functional organic molecules has been provided on surfaces of the die pads $3a$ at a border area of the inner leads $302a$ and the outer leads $301a$ (portion S of FIG. 1B).

The following is a detailed description of the organic coating 110.

2. Structure of the Organic Coating 110

Figure 2:
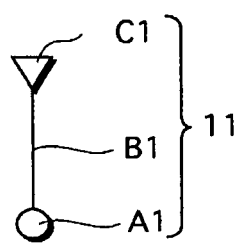
FIG. 2 is a schematic view showing a structure of a functional organic molecule pertaining to embodiment 1.

FIG. 2 shows a schematic structure of a functional organic molecule 11. The functional organic molecule shown in FIG. 2 includes a first functional group A1, a main chain B1, and a second functional group C1 that have been combined in the stated order.

The main chain B1 includes a component such as a methylene chain, a fluoromethylene chain, a siloxane chain, or the like.

The first functional group A1 is a functional part that is constituted from one of or a combination of a compound, chemical structure, or derivative that exhibits a metal bonding property.

The second functional group C1 is a functional part that is constituted from one of or a combination of a compound, chemical structure, or derivative that exhibits a hardening effect or hardening-promoting effect on thermoset resin.

As shown in FIG. 1C, given that the first functional group A1 orients itself so as to bond to the surface of the die pad $3a$ composed of a metallic material, each of the functional organic molecules 11 is oriented such that the second functional group C1 at the other end of the main chain B1 faces away from the surface of the die pad $3a$. Accordingly, there is formed a single-molecule film (organic coating 110) with molecular orientation-related chemical properties (e.g., mutual affinity), that is to say, there is formed a self-assembling structure. The film thickness of the organic coating 110 depends on the length of the functional organic molecules 11, but is adjusted here to the order of several nm (FIG. 1C).

Accordingly, the organic coating 110 can precisely protect the surface of the die pad $3a$ at the single-molecular level, and as a result, can function to prevent corrosion by the adhesion of water and oxygen gas, and favorably prevent substitution with electropositive metal salts.

Note that it is necessary to perform electrical connection with the semiconductor chip 4 by wire bonding, die bonding, or the like to the outer leads 301a, and there are cases in which a coating such as a metal plating is formed on connection areas of at least the die pads and the wiring lead 3 in order to maintain favorable electrical conductivity. Given that a metal plating step is required in such cases, it is preferable to provide the organic coating 110 on portions of the die pad 3a surface that have not been plated, thereby enabling suppression of the problem of the metallic component of the die pad 3a eluting into the plating fluid due to the ionization tendency of the metallic component.

The general formula of the functional organic molecules 11 is expressed as $A1-(B1)_n-C1$. In the formula, it is favorable form to be approximately 4 to 40. If n is too small, the main chain B1 is too short, there is a weakening of the intermolecule hydrophobic affinity action, which arises from the hydrophobic property of the main chain B1, between the functional organic molecules 11 when the first functional group A1 adheres to the die pads 3a, and the outward-facing orientation of the second functional group C1 is readily lost. Also, if n is too large, the main chain B1 is too long, and the ability to solder, wiring bond, die bond, etc. with the die pad 3a is readily impaired.

Note that the main chain B1 may have a structure in which a lateral chain is arbitrarily joined thereto.

The following is a detailed description of possible chemical structures of the functional organic molecules 11 of embodiment 1.

First Functional Group A1

As mentioned above, it is required that the first functional group A1 have affinity with metallic materials and a metal bonding property (including coordinate bonding). The first functional group A1 may be any one of or a combination of a compound, chemical structure, or derivative, as long as the above properties are ensured.

For example, hydrogen bonding or coordinate bonding with metal atoms is favorably ensured when using thiol, a thiol compound, a sulfide compound (e.g., a disulfide compound), a nitrogen-containing heterocyclic compound (e.g., an azole compound or azine compound), or one of or a combination of a compound, chemical structure, or derivative that includes any of the above compounds.

If the first functional group A1 includes a thiol group (R—SH, where R is an arbitrary functional group such as alkane or alkene), the functional organic molecules 11 adhere to the die pad 3a by coordinating with a metal atom that can become a single-valent or greater cation (e.g., a gold (Au) or silver (Ag) atom), and forming a covalent bond such as Au—S—R or Ag—S—R. Similarly, if the first functional group A1 is a disulfide group ($R_1$—S—S—$R_2$), covalent bonds such as Au(—S—$R_1$) (—S—$R_2$) or Ag(—S—$R_1$) (—S—$R_2$) are formed, thereby obtaining a strong bond structure.

If the first functional group A1 includes an azole compound or an azine compound, noncovalent electron pairs of nitrogen atoms in the components of these compounds can form coordinate bonds with metals that can be double valent or greater cations. This is favorable since, for example, imidazole compounds, benzotriazole compounds, triazine compounds and the like readily form mainly coordinate bonds with metals such as Cu.

Note that covalent bonds, coordinate bonds, hydrogen bonds etc. are formed at the same time depending on the type of the compound. Even stronger bond structures can therefore be achieved since two or more types of bonds are formed.

Main Chain B1

The main chain B1 can be a general methylene series organic molecule or various types thereof (a compound, chemical structure, or derivative including one or more of a methylene chain, a fluoromethylene chain, or a siloxane chain) or, the like. A methylene chain is favorable since molecules therein can assemble with each other to supramolecularly form a precise carbon chain of a hydrocarbon chain. Also, it has become clear upon examination by the inventors that the organic coating can be formed relatively speedily if a methylene chain is used.

If a fluoromethylene chain is used as the main chain B1, the infiltration of water between the wiring lead 3 and the organic coating is suppressed to a great degree since the organic coating is more hydrophobic than when using the methylene chain. This is favorable since preferable bonding between the organic coating and the wiring lead is maintained, and detachment of the organic coating due to thermal history does not readily occur.

Thermal resistance and weatherability properties can be achieved if a siloxane chain is used in the main chain B1. This enables the effect of preventing deformation and damage to the organic coating even if exposed to a relatively high temperature environment in, for example, an implementation step for semiconductor elements etc.

Second Functional Group C1

It is required that the second functional group C1 have a resin hardening property or a resin-hardening promoting property for thermoset resin. The second functional group C1 may be any one of or a combination of a compound, chemical structure, or derivative, as long as the above properties are ensured.

For example, the second functional group C1 may be one of or a combination of a compound, chemical structure, or derivative that includes one or more of a compound containing a hydroxyl group, a compound containing a carboxylic acid, a compound containing an acid anhydride, a compound containing a primary amine, a compound containing a secondary amine, a compound containing a tertiary amine, a compound containing a quaternary ammonium salt, a compound containing an amide group, a compound containing an imide group, a compound containing a hydrazide group, a compound containing an imine group, a compound containing an amadine group, a compound containing an imidazole, a compound containing a triazole, a compound containing a tetrazole, a compound containing a thiol group, a compound containing a sulfide group, a compound containing a disulfide group, a compound containing a diazabicylco-octane, an organic phosphine compound, or a compound containing a borontrifluoride amine complex. If any of these compounds, derivatives thereof, etc. are used, a hardening reaction instantly occurs when there is contact with the thermoset resin, thereby bonding the second functional group C1 and the resin together.

If phthalic anhydride, which is an acid anhydride, is used, the second functional group C1 acts as an epoxy resin hardening agent, and forms a bond by ring-opening polymerization with the epoxy groups in the epoxy resin.

If 1,8-diazabicyclo(5.4.0)undecene-7 (DBU), which is a compound including diazabicyclo-undecene, is used, the second functional group C1 acts a hardening promoting agent for the epoxy groups in the epoxy resin and hydroxyl groups, acid anhydrides etc., thereby accelerating the polymerization reaction of the epoxy groups and the hydroxyl groups, acid anhydrides etc.

Figure 3:
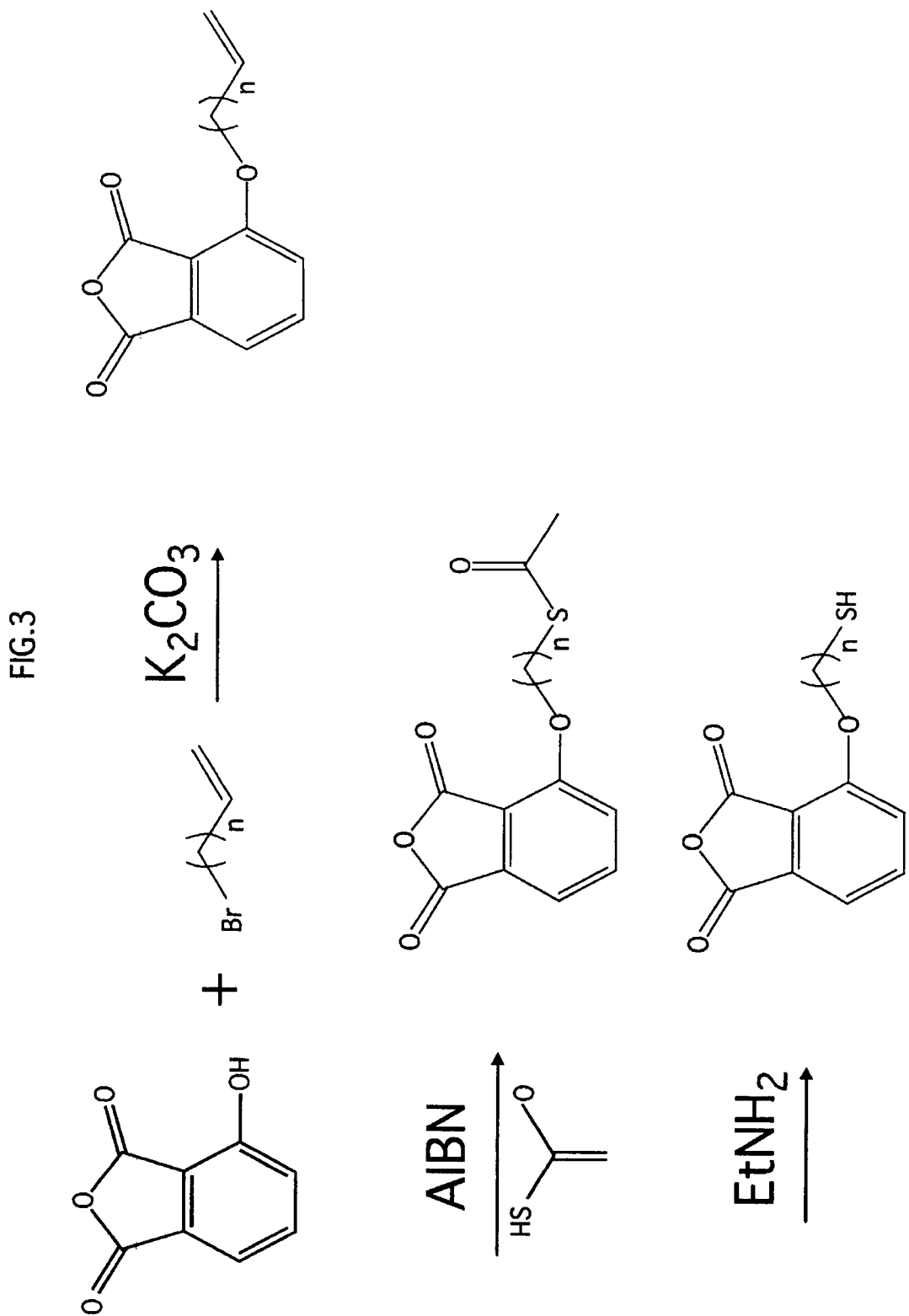
FIG. 3 shows a synthesis reaction process of the functional organic molecule having a second functional group with a resin hardening property, pertaining to embodiment 1.

FIG. 3 shows a synthesis reaction process of the functional organic molecule 11 in which the first functional group is a thiol group, the main chain is a methylene chain, and the second functional group is phthalic anhydride.

As shown in FIG. 3, an ether bond is formed between vinylalkane having bromine at one end and 3-hydroxy phthalic anhydride in the presence of potassium carbonate by a hydrogen bromide elimination reaction, and an ethane removal condensation reaction is caused between the resulting compound and acetyl thiol in the presence of AIBN (2,2-azobis(2-methylpropionitrile)). One end of the resulting compound can be converted to thiol by a hydrogen replacement reaction by ethylamine.

FIG. 4 shows a synthesis reaction process of the functional organic molecule 11 in which the first functional group is a thiol group, the main chain is a methylene chain, and the second functional group is DBU.

First, the DBU and the vinylalkane having bromine at one end are bonded in the presence of normal butyllithium by a hydrogen bromide elimination reaction. Thereafter, an ethane removal condensation reaction is caused between the resulting compound and acetyl thiol in the presence of AIBN. One end of the resulting compound can be converted to thiol by a hydrogen replacement reaction by ethylamine.

3. Manufacturing Method for the Semiconductor Device

The following is a description of a manufacturing method for the QFP 10 of embodiment 1.

The QFP 10 is manufactured by an organic coating formation step of depositing the organic coating 110 on predetermined surfaces of the die pad 3a, and thereafter a resin adhering step of resin-sealing the die pad 3a, the semiconductor chip 4, and the like.

3.1 Organic Coating Formation Step

Figure 5A:
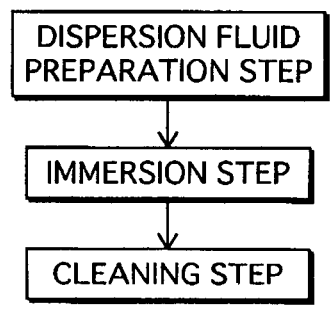
FIGS. 5A and 5B show a film formation process for an organic coating pertaining to embodiment 1.

The organic coating formation step includes a dispersion fluid preparation substep, a film formation substep, and a cleaning substep in the stated order (FIG. 5A).

Dispersion Fluid Preparation Substep

The dispersion fluid is prepared by dispersing the functional organic molecules 11 in a predetermined solvent. The solvent may be an organic solvent and/or water. When water is used as the solvent, it is preferable to add an anion series, cation series, or noion series surface-activating agent as necessary in order to obtain dispersal of the functional organic molecules 11. Furthermore, a boric acid series, phosphoric acid series, or other pH buffering agent may be added in order to stabilize the functional organic molecules 11.

Film Formation Substep

Next, the predetermined surfaces of the die pad 3a are immersed in the prepared dispersion fluid.

In the dispersion fluid, each of the functional organic molecules 11 is at an energy level having relatively high Gibbs free energy, and is moving randomly in reactive directions due to interaction between molecules (so-called Brownian motion).

Consequently, when the die pad 3a composed of a metallic material is immersed in the dispersion fluid, the functional organic molecules form metallic bonds with the die pad 3a on the micro level by the first functional group, and attempts to transition to a more stable state.

Figure 5B:
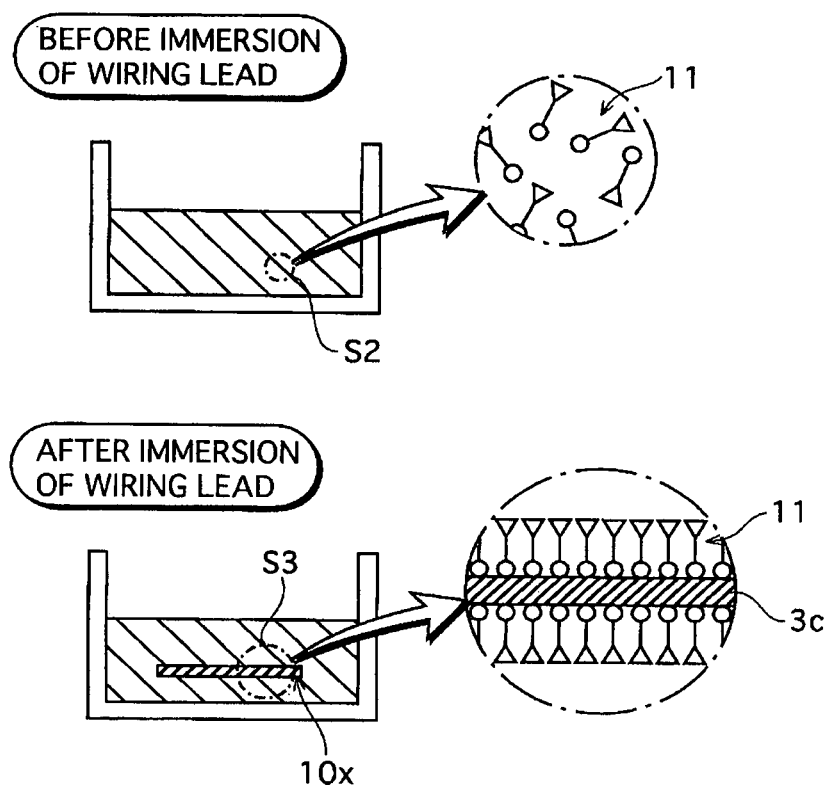

On the macro level, this transition to a stable state involves each of the functional organic molecules 11 stabilizing itself by bonding its first functional group A1 to the surface of the die pad 3a, while aligning its main chain B1 and second functional group C1, thereby self-assembling to form a single-molecule film (FIG. 5B).

The die pad 3a is lifted out of the dispersion fluid after the self-assembling film has been formed according to the above principle. This obtains a member constituted from the die pad 3a on which the organic coating 110 has been formed (hereinafter, called a "wiring member 10x").

Note that although FIG. 5B describes an exemplary case in which the organic coating 110 is formed on all surfaces of the die pad 3a, a pattern mask having apertures of a predetermined shape of course may be placed on the surface of the die pad 3a, and the organic coating 110 may be formed on only surface portions of the die pad 3a that correspond to the apertures.

Note that although an immersion method using a dispersion fluid has been described above, the method of forming the organic coating 110 is not limited to this. For example, another method such as spraying may be used to form a similar organic coating 110.

Cleaning Substep

Cleaning processing is performed by using an organic solvent and/or water as a cleaning medium to remove excess functional organic molecules 11 from the wiring member 10x lifted out of the dispersion fluid. Functional organic molecules 11 that have not formed a direct metallic bond with the first functional group A1 should be removed since they do not contribute to the effect of the present invention. The cleaning substep enables the simple removal of functional organic molecules 11 that have not formed a metallic bond with the die pad 3a.

This completes the organic coating formation step.

3.2 Resin Adhering Step

The resin adhering step includes a wiring member mounting substep and a resin filling substep in the stated order. The following describes each of these steps with reference to the schematic views of FIGS. 6A and 6B.

Wiring Member Mounting Substep

Figure 6A:
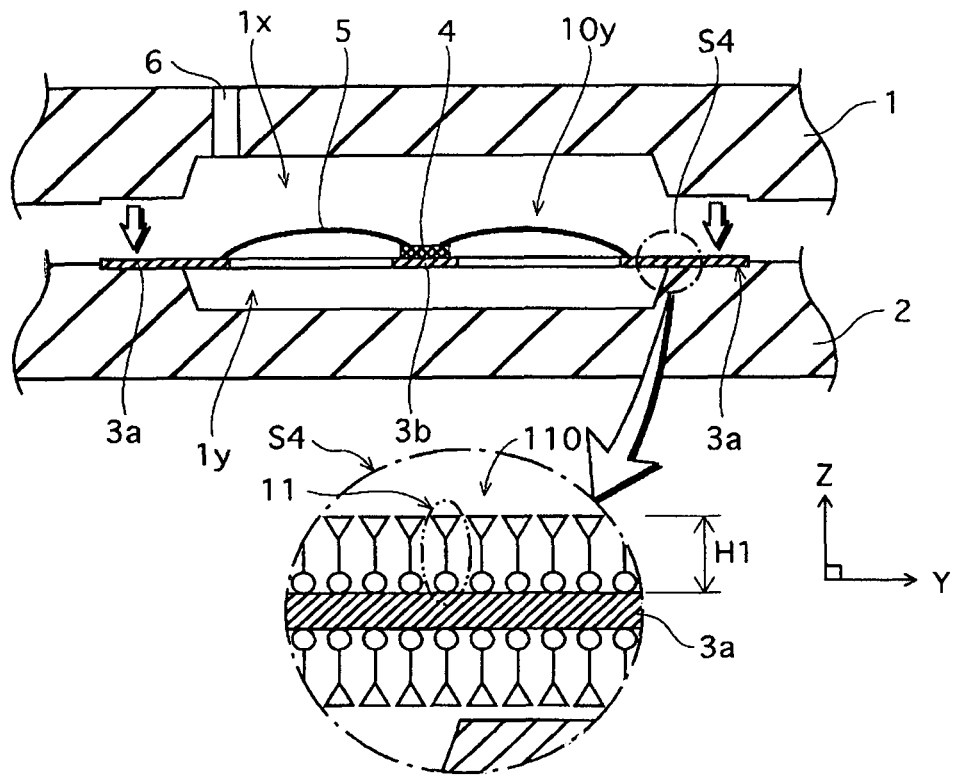
FIGS. 6A and 6B show a resin adhering process pertaining to embodiment 1.

First, the semiconductor chip 4 is mounted to the die pad 3b. The semiconductor chip 4 is connected to the wiring member 10x created in the organic coating formation step via the wiring lead 5 etc. A resulting chip-attached wiring member 10y is placed on the fixed die 2 (FIG. 6A).

Next, the movable die 1 is moved in the direction of the arrows to close the dies 1 and 2. At this time, the precise organic coating 110 has been formed to a single-molecular level thickness H1 on the surface of the wiring lead 3 of the chip-attached wiring member 10y, with the second functional groups C1 of the functional organic molecules 11 facing away from the surface of the wiring lead 3 (enlarged view of portion S4 of FIG. 6A). The area where the organic coating 110 has been formed includes areas that do not directly face cavities 1x and 1y (interior spaces) secured between the dies 1 and 2. In other words, the area of the organic coating 110 is a larger area than where the resin sealing is to be performed later.

Resin Filling Substep

Figure 6B:
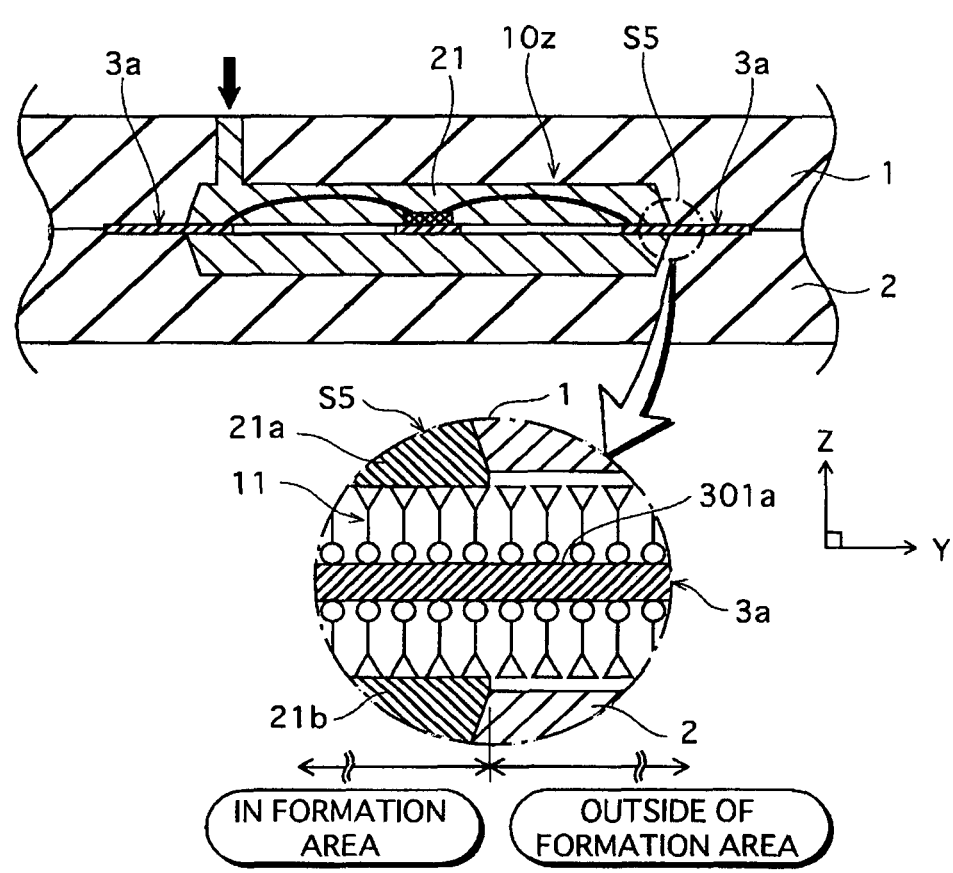

The dies 1 and 2, which are in the closed state, are set to a predetermined heated condition. A fluid-state thermoset resin material is injected into the cavities 1x and 1y at a predetermined pressure via the gate 6. The resin material is filled mainly in the area including the semiconductor chip 4 of the chip-attached wiring member 10y until the cavities 1x and 1y are completely filled, and then hardens by receiving heat from the dies 1 and 2 (FIG. 6B). Formation of the sealing resin is complete once the resin material has completely hardened after a predetermined time, thereby obtaining a QFP 10z. The QFP 10 is then completed by bending the outer leads 301a.

In this step, portions of the filled resin material that come into contact with the organic coating 110 are affected by the second functional group C1 (resin hardening effect or resin-hardening promoting effect), and harden relatively quickly ("IN FORMATION AREA" of FIG. 6B). Even if there are unnecessary gaps between facing surfaces of the dies 1 and 2, the above effect causes the resin material to almost completely harden before leaking into the gaps between the dies at the periphery of the cavities $1x$ and $1y$ ("OUTSIDE OF FORMATION AREA" of FIG. 6B). This enables effectively suppressing the formation of resin burrs in gaps between the dies 1 and 2 (enlarged view of portion S5 in FIG. 6B). Accordingly, it is possible to greatly reduce the occurrence of resin burrs on the outer leads 301a of the semiconductor device after formation of the sealing resin. This eliminates the need for a separate processing step for removing resin burrs and enables a speedy transition to other steps such as for connecting the semiconductor device to another substrate, thereby realizing superior manufacturing efficiency.

Compared with conventional technology, the use of the organic coating 110 in the QFP 10 obtained by the aforementioned steps ensures stronger adhesion between the die pad 3a and the molded resin. Consequently, when the QFP 10 is connected to another substrate, there is no resin detachment from the wiring lead due to heat damage, nor are there failures such as cracks. Moreover, given that the main chain of the functional organic molecules exhibit a hydrophobic property, precisely providing such molecules on the surface of the wiring member enables suppressing unnecessary adsorption of water to the wiring lead. This also suppresses ionization of the surface metal due to the application of a voltage, thereby achieving the effect of suppressing migration.

Also, since the organic coating 110 is a single-molecule film, the provision thereof causes almost no increase in the thickness of the semiconductor apparatus, and there is also no problem of the volume of the organic coating causing a practical shortage of resin material to be filled into the cavities. As such, the excellent effects of the present invention can be obtained while using the same manufacturing facilities as in conventional technology.

Embodiment 2

The organic coating 110 composed of the functional organic molecules 11 pertaining to the present invention has various effects when applied to a semiconductor device as mentioned above, but this is nothing more than one example. The existence of a semiconductor chip is not required. For example, the organic coating 110 can be applied to an LED device that includes a light emitting diode (LED) element instead of a semiconductor chip.

Figure 7:
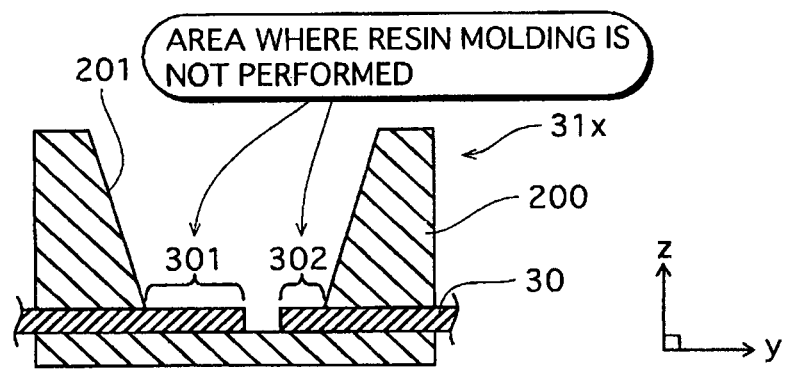
FIG. 7 shows a structure of an LED device pertaining to embodiment 2.

FIG. 7 is a schematic cross-sectional view showing a structure of a wiring lead 30 and a reflector 22 of an LED device unit $31x$ of embodiment 2 of the present invention.

In a cross-sectional structure of the LED device unit $31x$, the wiring lead 30 has been provided on a bottom portion of the mortar-shaped reflector 22. The reflector 22 is formed by a resin mold using a thermoset resin material (e.g., epoxy resin).

Similarly to embodiment 1, there is the possibility of resin burrs forming in the LED device unit $31x$ as well. Specifically, areas 301 and 302 of the wiring lead 30 that are exposed at the bottom of the reflector 22 must retain conductivity since an LED chip 42 is mounted thereupon later (see FIG. 8B), and due to the same principle as in embodiment 1, resin burrs can form on the exposed areas 301 and 302 during resin molding, from the bottom edges of the reflector 22 through gaps between the dies. Another processing step for removing the resin burrs is therefore necessary, and the LED cannot be mounted with favorable manufacturing efficiency.

Here, forming the organic coating 110 composed of the functional organic molecules 11 of the present invention on at least the exposed areas 301 and 302 of the wiring lead 30 before the resin adhering step enables speedily hardening the thermoset resin material during resin molding. This prevents the resin material from leaking from the bottom edges of the reflector 22 and resolves the aforementioned problems pertaining to the occurrence of resin burrs.

Supplementary Remarks about Embodiments 1 and 2

The hardening promoting effect for thermoset resin that is achieved by providing the organic coating 110 in embodiments 1 and 2 can also be used to securely form a fine resin pattern.

For example, there is a case in which precise resin molding is required in the technological field of performing localized resin molding on a portion of a wiring plate surface by an inkjet method. In this case, first forming the organic coating enables faster resin molding than can be performed in a case of performing resin molding directly on the wiring lead 30. Resin dripping and loss of resin shape after application do not readily occur since the hardening time is short, which has the benefit of enabling the use of resin molding for precise patterns as planned.

Also, the organic coating of embodiments 1 and 2 is not limited to being formed directly on the die pad and the wiring lead. For example, a plating coat may be formed on the surfaces of the die pad and the wiring lead, and the organic coating may be formed thereupon. However, in this case the functional groups must be selected such that the second functional group C1 has the predetermined bonding properties.

Embodiment 3

The following is a description of embodiment 3 of the present invention focusing on differences from embodiment 2.

LED Device Structure

Figure 8A:
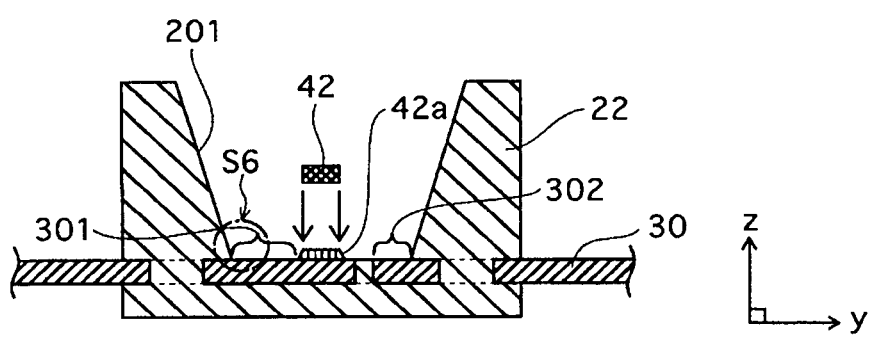
FIGS. 8A to 8C show a structure of and manufacturing process for an LED device pertaining to embodiment 3.
Figure 8B:
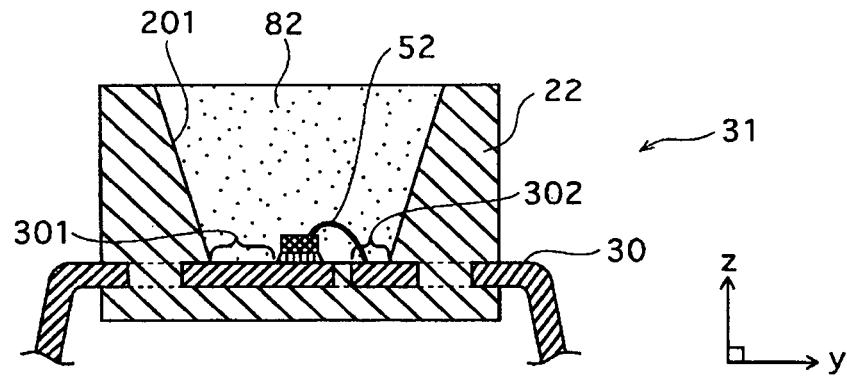
Figure 8C:
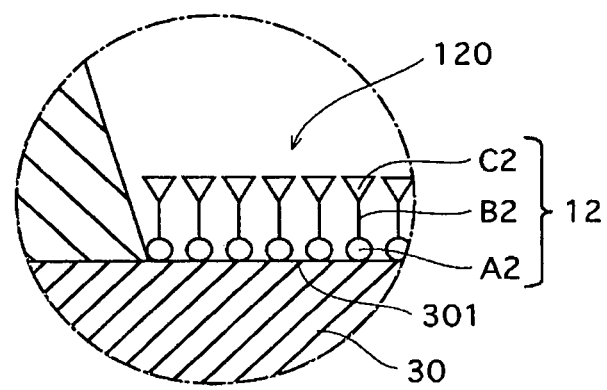

FIGS. 8A to 8C are cross-sectional views showing a structure of and manufacturing steps for an LED device 31 pertaining to embodiment 3 of the present invention.

The LED device 31 basically includes the device unit $31x$ of embodiment 2, and as shown in FIG. 8B, further includes an LED chip 42 that has been bonded, via a paste 42a, on the wiring lead 30 surrounded by the reflector 22. The LED chip 42 is connected to the wiring lead 30 via the wire 52.

A transparent sealing resin 82 is filled into the reflector 22 on a reflector surface 201 and the exposed areas 301 and 3102 so as to seal the LED chip 42 and the like.

Silicone resin, which is one example of a thermoset resin, is used as the sealing resin 82.

In embodiment 3, an organic coating 120, which is composed of a single-molecule film formed by the self-assembly of functional organic molecules 12, has been formed on the surface of the exposed areas 301 and 302 of the wiring lead 30. The functional organic molecules 12 are expressed by the general formula A-(B)$_n$—C, and have a characteristic feature in which a first functional group A2 having a metal bonding property is provided at one end of a main chain B2, and a second functional group C2 having a resin bonding property for silicone resin is provided at the other end of the main chain B2, (FIG. 8C).

In embodiment 3 having the above structure, peeling of the silicone resin from the wiring lead 30 is effectively prevented more than in conventional structures due to the presence of the organic coating 120 composed of the functional organic molecules 12 having the first and second functional groups A2 and C2.

Specifically, although having superior anti-discoloration properties and transparency over epoxy resin, silicone resin readily deforms under high temperatures due to having a high thermal expansion coefficient, and there is the fear that such deformation will cause peeling and detachment from the wiring lead 30. In contrast, in embodiment 3 the use of the organic coating 120 composed of the functional organic molecules 12 causes a significant improvement in adhesion between the wiring lead 30 and the silicone resin, and eliminates peeling and detachment even if, for example, the silicone resin is somewhat deformed by heat etc. This achieves stable functioning of the LED device 31 even in high temperature environments and during long periods of operation.

Note that the silicone resin may also be a silicone resin-containing conductive paste (die bonding agent such as Ag paste). Performing die bonding using the silicone resin-containing conductive paste enables securely bonding the semiconductor chip of the LED etc. to the die pad. The fact that silicone resin-containing conductive paste degrades to a lesser degree than a conventional epoxy resin-containing conductive paste enables the stabilization of electrical conductivity and pyroconductivity.

Structure of the Functional Organic Molecules 12

The same first functional group A1 and main chain B1 of embodiment 1 can be used as the first functional group A2 and main chain B2 respectively in the functional organic molecules 12 of embodiment 3.

The second functional group C2 is a functional group, compound, or structure that has a hardening property for a thermoset resin, and in particular for silicone resin. Specifically, the second functional group C2 can be any of a compound, chemical structure, or derivative that includes a vinyl group and/or an organic hydrogen silane.

Figure 9:
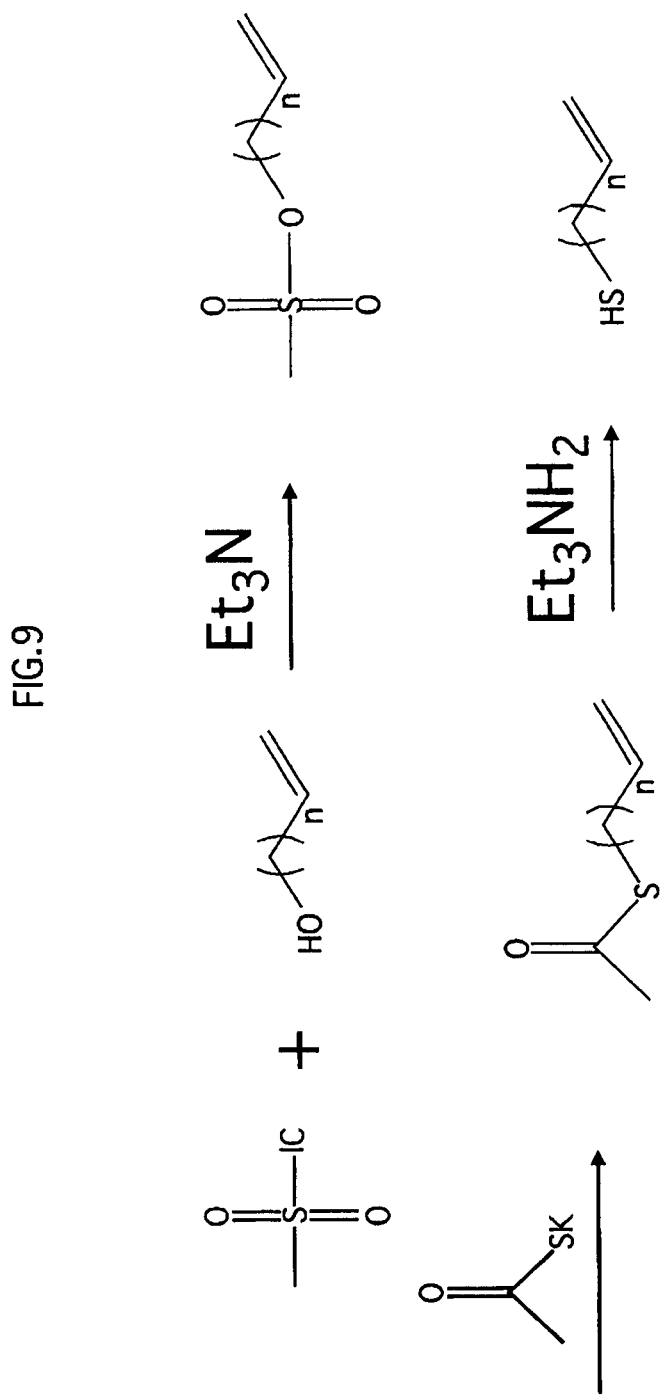
FIG. 9 shows a synthesis reaction process of a functional organic molecule pertaining to embodiment 3.

FIG. 9 shows an exemplary synthesis reaction process of a functional organic molecule 12 in which the first functional group A2 is a thiol group, the main chain B2 is a methylene chain, and the second functional group C2 is a vinyl group.

First, an ether bond is formed between methane sulfonyl chloride and vinylalkane having a hydroxyl group at one end in the presence of triethylamine, by hydrochloride elimination. In the resulting compound, the methane sulfonyl chloride part is replaced with acetylsulfide by thioacetate potassium. Thereafter, the acetylsulfide part is replaced with thiol by ethylamine. This obtains the functional organic molecules 12.

Manufacturing Method for the LED Device

The manufacturing method for the LED device can be implemented by successively performing the following steps. Note that with the exception of the organic coating formation step, a heretofore known manufacturing method for an LED device may be employed.

Organic Coating Formation Step

The organic coating 120 composed of the functional organic molecules 12 is formed as a self-assembled single molecule film on the surface of the wiring lead 30 in the same way as the organic coating formation step of embodiment 1, thereby obtaining the wiring lead 30 having an organic coating formed thereupon.

Resin Adhering Step

A the thermoplasticizing resin material such as polyphthalamide resin is injected onto the wiring lead 30, which has the organic coating 120 formed thereupon, in the same way as the injecting molding procedure shown in FIGS. 6A and 6B. Thereafter, cooling to a predetermined temperature range is performed to harden the resin. This forms the reflector 22 and obtains the LED device unit 31*x*.

Thereafter, the LED chip 42 is mounted on the wiring lead 30 via the paste 42*a*. The wiring lead 30 and LED chip 42 are connected via the wire 52.

Thereafter, the silicone resin material, which is in a fluid state, is filled into the reflector 22. The LED device 31 is then obtained by causing the resin to harden.

Embodiment 4

The following is a description of embodiment 4 focusing on differences from embodiment 3.

Figure 10A:
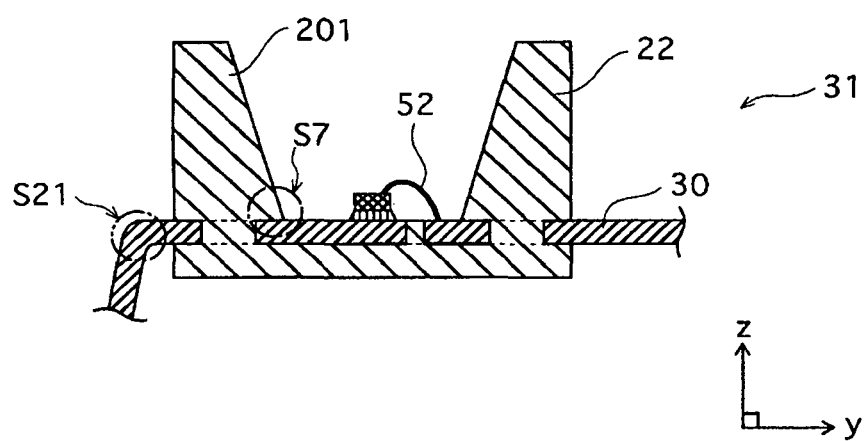
FIGS. 10A and 10B show a structure etc. of an LED device pertaining to embodiment 4.

In embodiment 3, a functional group having a specialized chemical bonding property for silicone resin is selected as the second functional group C2 of the functional organic molecules 12 constituting the organic coating 120. However, embodiment 4 has a characteristic feature in that a functional group having a flash hardening property is selected as a second functional group C2' of functional organic molecules 12*a* (enlarged view of portion S7 in FIG. 10).

Specifically, the second functional group C2' may be a compound, chemical structure or derivative that includes one or more of a platinum complex, a palladium complex, a ruthenium complex, and a rhodium complex.

A manufacturing method of the LED device of embodiment 4 is the same as the manufacturing method of embodiment 3.

In the LED device 31 having the above structure, the reflector 22 is formed by injection molding using a thermoplasticizing resin such as polyphthalamide resin.

Figure 10B:
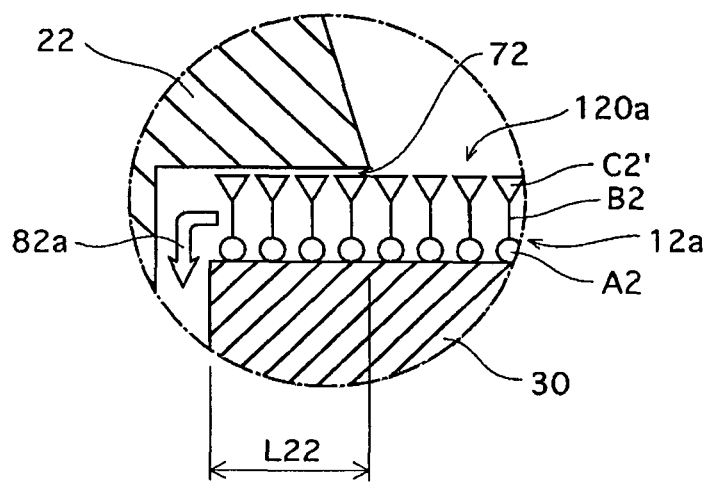

At this time, the thermoplasticizing resin is cooled and hardened, and there are cases in which the resin experiences volume shrinkage. In such cases, there is the possibility of a gap 72 forming between the wiring lead 30 and the reflector 22 (FIG. 10B).

The gap 72 invites excessive leaked resin 82*a* during filling of the silicone resin, which is a waste of material. The leaked resin 82*a* also leads to the degradation of the electrical connectivity of the outer lead portion of the wiring lead 30, thereby requiring a separate removal step and bringing about a reduction in manufacturing efficiency. Furthermore, the leaked resin 82*a* is undesirable in that its existence under a heat sink (not depicted) attached to the back surface of the LED device 31 causes impairment of the radiation performance of the heat sink.

In contrast, in embodiment 4, a functional group having a flash hardening property is provided as the second functional group C2' of the functional organic molecules 12*a*, thereby causing the silicone resin that is filled into the reflector 22 to harden immediately after filling. As a result, solid silicone resin is formed quickly on the bottom portion of the mortar-shaped reflector 22, thereby plugging any gaps. This effectively prevents the silicone resin material that continues to be filled from flowing into the gaps. Accordingly, there is no need for a separate step for removing the leaked resin 82*a*, thereby enabling a commensurate improvement in manufacturing efficiency.

Furthermore, electrical conduction with external devices via the outer leads of the wiring lead 30 is not inhibited since the leaked resin 82*a* is not deposited on the outer leads. This enables highly reliably performing electric connection with the LED 31 by a method such as solder connection.

Also, preventing the leaking of silicone resin into the gaps enables suppressing the occurrence of voids (air bubbles) in resin in the gaps, which further improves the silicone resin seal properties.

Note that in order to favorably obtain the aforementioned effects, the area in which the organic coating 120*a* is provided is, as shown in the enlarged view of portion S7 in FIG. 10B, extended to area L22 which is in the gap 72 between the reflector 22 and the wiring lead 30. This is preferable since, even if the leaked resin 82a flows to some extent into the gap 72, the resin hardens before the leak can expand to a larger scale, thereby preventing any further leaking.

Second Functional Group C2'

Figure 11:
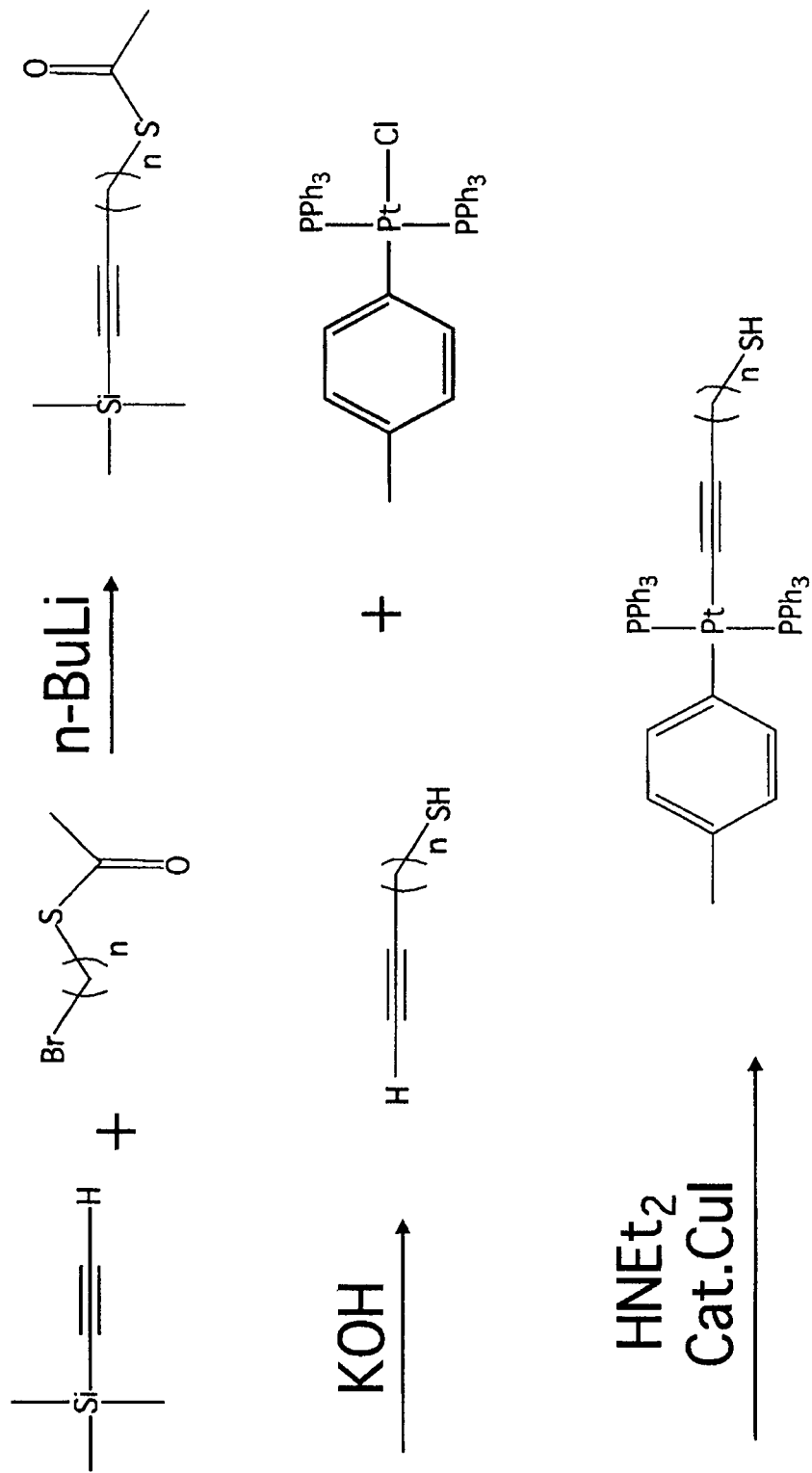
FIG. 11 shows a synthesis reaction process of a functional organic molecule pertaining to embodiment 4.

FIG. 11 shows an exemplary synthesis reaction in a case of the functional organic molecules 12a of embodiment 4 having a molecular structure in which the first functional group A2 is a thiol group, the main chain B2 is a methylene chain, and the second functional group C2' is a platinum complex.

First, a hydrogen bromide elimination and condensation reaction are caused between ethynyltrimethylsilane and acetylsulfide alkane having bromine at one end, in the presence of n-butyllithium.

Next, the acetyl group and trimethylsilane at both ends of the resulting compound are replaced with hydrogen by potassium hydroxide. Furthermore, according to a recitation in the *Journal of Organometallic Chemistry*, 641 (2002) 53-61, a hydrogen chloride elimination and condensation reaction is caused by diethylamine in the presence of trans-para-toluene diphenyl phosphine platinum chloride complex [trans-(p-tol) $(Ph_3P)_2PtCl$] and a copper bromide catalyst. This results in the synthesis of the functional organic molecules 12a.

Embodiment 5

The following is a description of embodiment 5 focusing on differences from embodiment 4.

An LED device of embodiment 5 has a characteristic feature in that a second functional group C3 of functional organic molecules 13 is a fluorescent or phosphorescent functional group, thereby improving luminous efficiency.

Figure 12A:
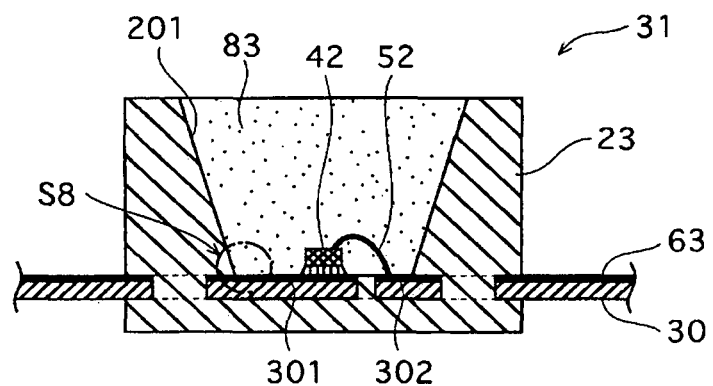
FIGS. 12A and 12B show a structure of an LED device pertaining to embodiment 5.

There are cases in which an Ag plating coat 63 (FIG. 12A) is provided for improving reflection over conventional technology in order to effectively use light emitted from the LED chip 42. However, only light with a wavelength of approximately 500 nm or more is effectively reflected by Ag silver materials, and it is difficult to obtain an effective reflection rate for light of shorter wavelengths (e.g., blue light and ultraviolet light with wavelengths of around 380 nm to 500 nm).

Figure 12B:
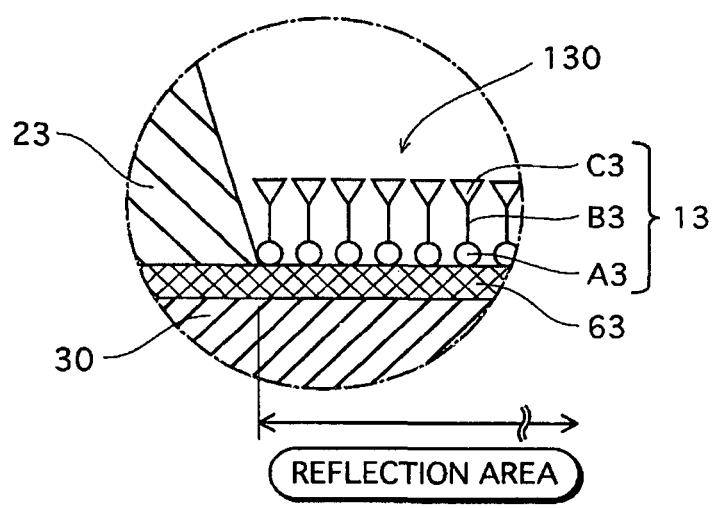

In contrast, in the present invention, an organic coating 130 is formed on the Ag plating coat 63 in areas thereof that correspond to the exposed areas 301 and 302 of the wiring lead 30. The organic coating 130 includes functional organic molecules 13 having a structure in which the second functional group C3 converts short wavelength light to fluorescent or phosphorescent light (enlarged view of S8 in FIG. 12B). This aims to supplement the efficiency with which visible light is reflected by the Ag plating coat 63. The first functional group A3 and main chain B3 are the same as A1 and B1.

Specifically, according to the LED device 31 of embodiment 5 having the above structure, the long wavelength light components (light with wavelengths of approximately 500 nm or greater) of the light emitted by the LED chip 42 during operation is effectively directly reflected toward the front of the chip by the conventional Ag plating coat 63. At this time, the traveling of the long wavelength light is not hindered by the organic coating 130, which due to being a single-molecule film only has a single-molecular thickness. The long wavelength light passes through the organic coating 130 and reaches the Ag plating coat 63, and furthermore is reflected by the Ag plating coat 63 without any problems.

On the other hand, short wavelength light (light with a wavelength of approximately 380 to 500 nm) emitted by the LED chip 42 does not pass through the organic coating 130 due to having a higher energy level than long wavelength light. The density of the short wavelength light is most concentrated in a vicinity of the second functional groups C3 of the outward-oriented functional organic molecules 13. Also, the short wavelength light is used as light energy (E±hv) in the second functional group C3, and causes the energy level of the second functional group C3 to move to an excited state (E0→E1).

As a result, the aforementioned light energy (E=hv) ultimately changes to fluorescent or phosphorescent light emitted from the second functional group C3. In other words, ThE short wavelength light emitted from the LED chip 42 is not actually reflected by the organic coating 130, but rather the light energy (E=hv) of the short wavelength light is used as fluorescent or phosphorescent light, which looks the same as reflected light. As a result, light in both the short wavelength and long wavelength ranges emitted by the LED chip 42 effectively contributes to the luminous efficiency of the LED device 31. This enables the realization of an LED device 31 that is superior to conventional structures.

Note that embodiment 5 is also applicable to a structure in which a plating coat other than the Ag plating coat 63 is used. The light emitting properties of the LED chip 42 can be adjusting by the combination of the visible light directly reflected by the plating coat and the light emitted by the functional group C3. For example, light with a wavelength of approximately 600 nm or greater is effectively reflected if a metal plating coat is used. Therefore, visible light with a wavelength in the region of 600 nm is reflected by the metal plating coat, and light with a wavelength of approximately 600 nm to 700 nm is emitted as red fluorescent or phosphorescent light by the second functional group C3. This has the effect of enabling the realization of an LED device 31 specialized for improving luminance with respect to red light.

Second Functional Group C3

The second functional group C3 is required to have a fluorescent or phosphorescent light emitting property based on excitation by the aforementioned short wavelength light.

For example, the second functional group C3 may be a compound, chemical structure, or derivative including one or more of a bis styrylbiphenyl derivative or other stilbene derivative, a bis(triazinylamino)stilbene sulfonic acid derivative or other azole-modified stilbene derivative, a coumarin derivative, an oxazole derivative, a pyrazoline derivative, a pyrene derivative, and a porphyrin derivative.

Figure 13:
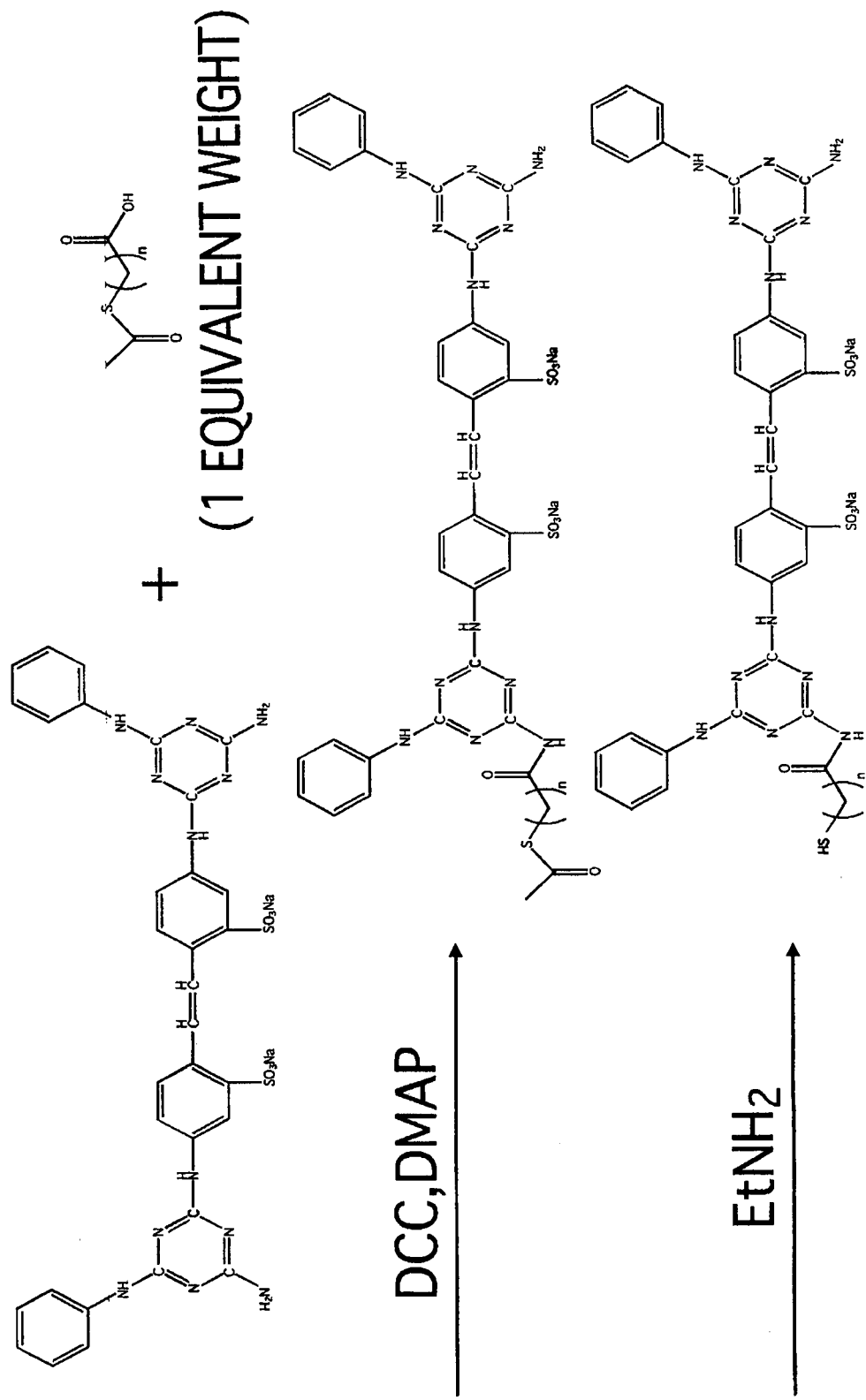
FIG. 13 shows a synthesis reaction process of a functional organic molecule pertaining to embodiment 5.

FIG. 13 shows an exemplary synthesis reaction of the functional organic molecules 13 in which the first functional group A3 is a thiol group, the main chain B3 is a methylene chain, and the second functional group C3 is a bis(triazinylamino)stilbene sulfonic acid derivative.

A dehydration and condensation reaction is caused between the bis(triazinylamino)stilbene sulfonic acid derivative and an equivalent weight of methylene acetylsulfide having carboxylic acid at one end in the presence of 1,3-dicyclohexylcarbodiimide (DCC) and 4-dimethylaminopyridine (DMAP). The acetylsulfide portion of the resulting dehydrated and condensed compound is replaced with thiol by ethylamine. This results in obtaining the functional organic molecules 13.

Remarks about Embodiments 1 to 5

The following additional effects can be achieved if the organic coating 110 etc. of the present invention is formed on the surface of the die pad and the wiring lead.

In order to improve adhesion with resin (e.g., epoxy resin), there are cases in which roughening processing is performed on the surface of the wiring lead in a semiconductor device such as an IC, LSI, etc. to create better cling with the resin.

Also, an appearance examination is performed for quality management of the semiconductor device to be manufactured. Generally, such an examination is performed by a laser measurement method using a laser emitting apparatus and a light receiving device. However, the irradiated laser is unnecessarily diffusely reflected off of the roughened surface, and it can be difficult to get accurate measurements due to a reduction in the amount of light received by the light receiving device or the reception of unnecessary light. This problem becomes significant when an outward appearance is examined at a microscopic level using a weak laser.

In response to this problem, if the organic coating of the present invention is formed on the roughened surface of the die pad and the wiring lead, the functional organic molecules absorb the laser light, convert the energy to fluorescent or phosphorescent light, and emit the fluorescent or phosphorescent light. This enables preventing diffuse reflection of the laser light due to unevenness in the rough surface. It is therefore possible to efficiently and accurately perform the appearance examination step, and also to improve manufacturing efficiency for the semiconductor device.

Embodiment 6

The following describes embodiment 6 of the present invention.

Embodiment 6 pertains to film carrier tape such as TAB (Tape Automated Bonding) tape, T-BGA (Tape Ball Grid Array) tape, and ASIC (Application Specific Integrated Circuit) tape, which is used in the implementation of electrical parts of the IC, LSI, etc., and in particular to technology for improving the adhesion of a solder resist layer formed on the film carrier tape.

FIGS. 14A to 14D are schematic cross-sectional views showing a manufacturing process for a film carrier tape 40 of embodiment 6.

Figure 14A:
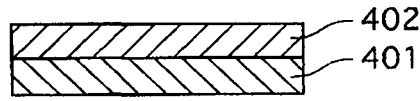
FIGS. 14A to 14D show a manufacturing process for a film carrier tape pertaining to embodiment 6.
Figure 14B:
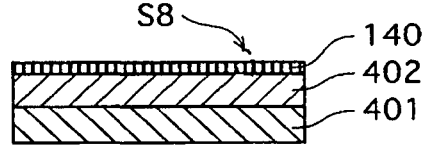
Figure 14C:
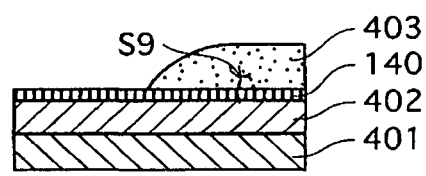
Figure 14D:
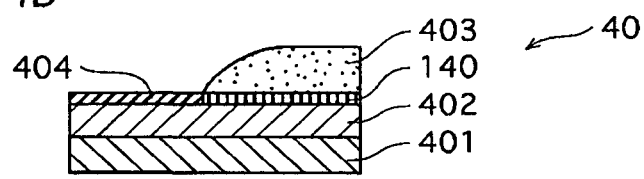

As shown in FIG. 14D, The film carrier tape 40 is constituted from an insulation film 401 composed of a polyimide or the like, a wiring pattern layer 402 composed of Cu, and, a solder resist layer 403 that have been laminated in the stated order.

The insulation film 401 and the solder resist layer 403 are constituted from an insulating resin material (e.g., a polyimide series, epoxy series, or urethane series resin), and are provided as insulation for preventing short-circuits of the wiring pattern layer 402.

An Sn plating layer 404 has been formed on the surface of the wiring pattern layer 402 for connection with implementation parts by soldering. An Sn material is preferable due to having solder wettability, flexibility, and lubricating properties, and being able to form a plating layer 404 suitable for use in the film carrier tape.

When forming the Sn plating layer 404 in the film carrier tape 40, the insulation film 401, the wiring pattern layer 402, and the solder resist layer 403 are first laminated in the stated order, and an electrolytic plating method step or the like is used to form an Sn plating by immersing the intermediate product in an Sn plating tank filled with an Sn plating fluid (e.g., an Sn-containing compound dissolved in BF4 solvent) that has been heated to a predetermined temperature. The Sn plating layer 404 is selectively formed on the wiring pattern layer 402 due to tin component's property of not adhering to the insulating material.

Here, a characteristic feature of embodiment 6 is that prior to the Sn plating step, an organic coating 140 has been formed on the wiring pattern layer 402 by the self-assembly of functional organic molecules 14. As shown in FIG. 14E, each of the functional organic molecules 14 has a structure including a main chain B4, a first functional group A4 at one end of the main chain B4, and a second functional group at the other end of the main chain B4. The first functional group A4 has a metal bonding property, and the second functional group C4 is a functional group having a high degree of adhesion to the solder resist layer 403 (e.g., a compound, chemical structure, or derivative including one or more of a phthalic anhydride, a pyromellitic acid dianhydride or other acid anhydride, and a primary amine compound).

The wiring pattern layer 402 and the solder resist layer 403 are securely adhered together via the organic coating 140, and edges of the solder resist layer 403 do not peel off of the wiring pattern layer 402 even during the Sn plating step involving immersion in the Sn plating tank heated to the predetermined temperature. This has the effects of preventing peeling of the solder resist layer 403, and enabling the formation of a favorable Sn plating layer 404.

Figure 22A:
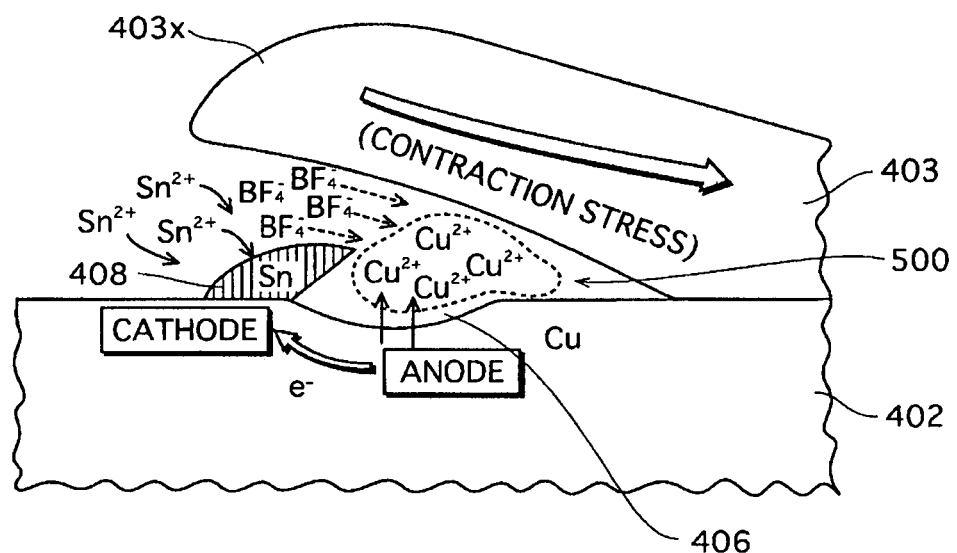
FIGS. 22A and 22B show a schematic view of a localized battery formation process and a structure of a film carrier tape according to conventional technology.

Embodiment 6 also has the effects of suppressing the formation of a so-called internal battery on the wiring pattern layer 402, and preventing corrosion of the surface thereof. The following describes the pertaining principle with use of the schematic enlarged view of FIG. 22A showing a vicinity of the wiring pattern layer 402 and the solder resist layer 403 during the plating step.

The solder resist layer 403 and the wiring pattern layer 402 experience thermal contraction and internal stress during hardening of the solder resist, due to the unique linear expansion coefficients of the materials of the layers.

Here, given that the plating fluid in the plating tank is heated to approximately 60° C., when the wiring pattern layer 402 having the solder resist layer 403 formed thereon is inserted in the plating fluid, the solder resist layer 403, which has higher internal stress than metal, experiences a relatively large degree of thermal expansion. Accordingly, an edge 403x of the solder resist layer 403, which is most easily influenced by thermal contraction forces, is pulled by the influence of the internal stress, and peels up off of the surface of the wiring pattern layer 402. The edge 403x then further lifts up due to remaining thermal contraction forces (internal stress) in the solder resist layer 403 since the plating fluid enters between the edge 403x and the wiring pattern layer 402. A solvent area 500 composed mainly of the solvent of the plating fluid and sparsely including Sn ions is formed between the raised edge 403x and the wiring pattern layer 402.

A concentration gradient with respect to the Sn component of the plating fluid occurs in the solvent area 500 and an adjacent area 501 in the proximity thereof. Also, due to differences in the ionization tendencies of Sn and Cu, Cu ions from the surface of the wiring pattern layer 402 seep into the solvent in the solvent area 500 which has a sparse amount of Sn ions. Electrons that are released from the wiring pattern layer 402 when the Cu ions appear are received by the Sn ions in the plating fluid, and a deposited layer 408 composed of deposited Sn is formed on the wiring pattern layer 402 in an area directly below the edge 403x of the solder resist 403. As shown in FIG. 22A, a so-called localized battery is formed due to a series of oxidation-reduction reactions between the Sn ions and the Cu ions (see Japanese Patent No. 2076342 for details of the formation process for the localized battery).

Figure 22B:
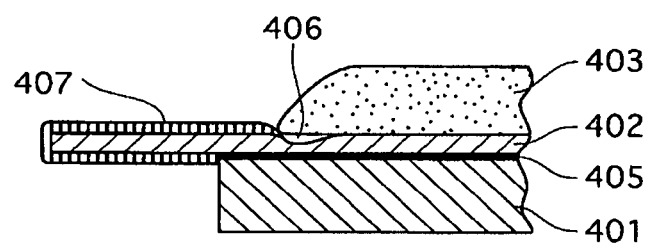
Figure 23A:
FIGS. 23A to 23D show a structure of a film carrier tape having two Sn plating layers according to conventional technology.
Figure 23B:
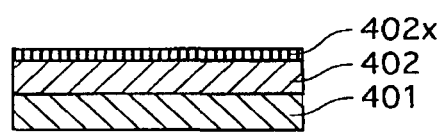
Figure 23C:
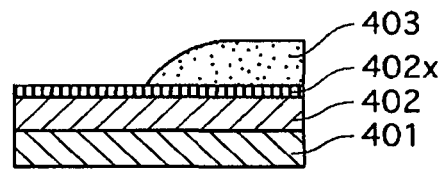
Figure 23D:
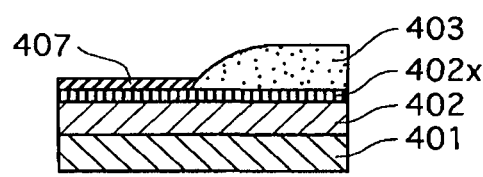

As the localized battery reaction progresses even further, the portion into which the Cu ions seeped becomes a corroded area 406. The corroded area 406 thereafter remains hidden from sight underneath the edge 403x (FIG. 22B). The corroded area 406 does not stand out visually, but failures such as ruptures in the film carrier tape can originate at the corroded area 406 when there are pulling forces etc. during manufacturing steps that use the film carrier tape.

In contrast, in the present invention, given that the solder resist layer 403 and the wiring pattern layer 402 are securely adhered by the organic coating 140, the edge 403x does not peel off of the wiring pattern layer 402 even if, for example, there is some degree of internal stress in the solder resist layer 403 with respect to the wiring pattern layer 402 during the plating step. The formation of the corroded area 406 can therefore be avoided since the solder resist layer 403 does not peel off of the wiring pattern layer 402. Also, although the solder resist layer 403 experiences thermal expansion when inserted into the plating tank, the internal stress can be eliminated by performing post-processing such as ordinary anneal processing after the plating step, thereby eliminating stress damage to the solder resist layer 403. Accordingly, embodiment 6 enables the formation of a favorable Sn plating layer 404, and furthermore enables the realization of a film carrier tape with superior mechanical strength.

Note that Japanese Patent No. 3076342 discloses technology for preventing the formation of the corroded area 406 by, as shown in FIGS. 23A to 23D, forming a first Sn plating layer 402x including a Cu component on the surface of the wiring pattern layer 402 before the provision of the solder resist layer 403, and thereafter forming the solder resist layer 403 and a second Sn plating layer 407. However, the present invention has significant differences from the aforementioned patent in that there is no need to perform the plating step twice, which shortens the manufacturing process and reduces the amount of plating fluid used and drainage thereof, thereby having the effect of reducing manufacturing costs and alleviating environmental problems.

Manufacturing Method

The following describes a manufacturing method for the film carrier tape 40 of embodiment 6.

First, the predetermined wiring pattern layer 402 (Cu foil) is formed on the insulation film 401 using a photoetching method or the like (FIG. 14A).

Figure 15A:
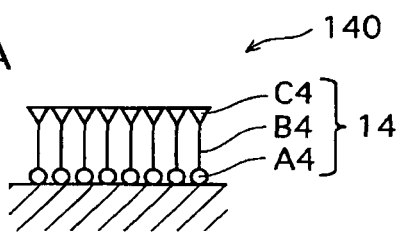
FIGS. 15A and 15B are structural views showing a periphery of a functional organic molecule pertaining to embodiment 6.

Next, in the organic coating formation step, the organic coating 140 composed of a single-molecule film is formed by the self-assembling effect of the functional organic molecules 14 deposited on the wiring pattern layer 402 (FIG. 14B, enlarged portion S8 of FIG. 15A).

Figure 15B:
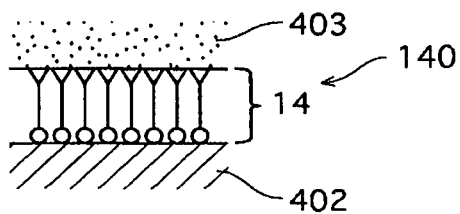

Then, in the solder resist layer formation step, the solder resist layer 403 is formed by applied a solder resist material paste to the organic coating 140 using a printing method or the like (FIG. 14C). At this time, the second functional group C4 causes the solder resist material to harden, thereby forming a chemical bond therebetween (enlarged portion S9 of FIG. 15B).

Then, the organic coating 140 in areas other than the formation area of the solder resist layer 403 is removed. Note that masking may be performed in the areas other than the formation area of the solder resist layer 403 in place of performing the removal processing.

Then, the Sn plating layer is formed in the predetermined area on the wiring pattern layer 402 by immersion of the organic coating 140 and the resist layer 403 in the Sn plating tank (FIG. 14D). The Sn plating layer is formed only on conductive material surfaces by using an electroless substitution plating method.

This completes the formation of the film carrier tape 40.

Figure 16:
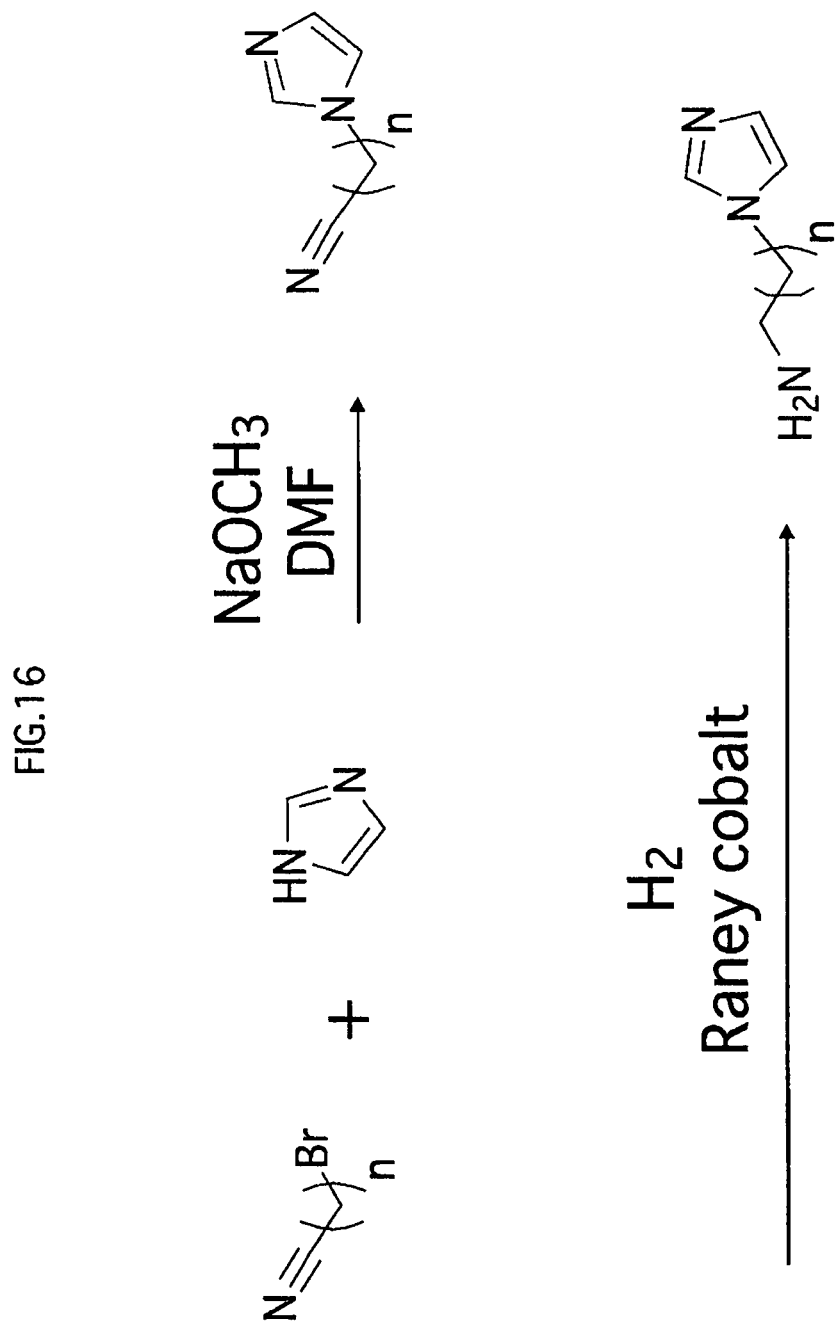
FIG. 16 shows a synthesis reaction process of the functional organic molecule pertaining to embodiment 6.

FIG. 16 shows an exemplary synthesis reaction process of the functional organic molecule of embodiment 6, in which the first functional group A4 is an imidazole group, the main chain B4 is a methylene chain, and the second functional group C4 is an amine.

The synthesis occurs according to the heretofore known recitation of the *Journal of Medicinal Chemistry*, 1987, 30, 185-193. Imidazole alkanenitrile is synthesized by forming a mixed solvent including dimethylformamide (DMF) and sodium methoxide doped with imidazole, and adding bromoalkanenitrile dissolved in DMF. The resulting compound is distilled and dissolved in a mixed solvent including methanol and trimethylamine, and a Reney cobalt catalyst is used to cause a hydrogen addition reaction with respect to the nitrile group. This completes the synthesis of the functional organic molecules.

Embodiment 7

The following describes a film carrier tape 40 of embodiment 7, focusing on differences from embodiment 6.

Figure 17A:
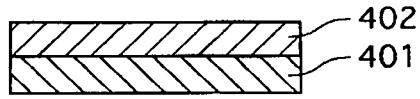
FIGS. 17A to 17D show a manufacturing process for a film carrier tape pertaining to embodiment 7.
Figure 17B:
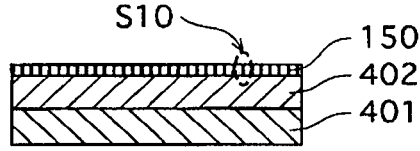
Figure 17C:
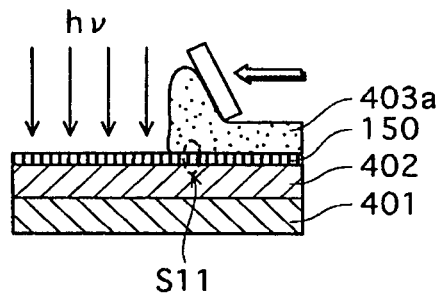
Figure 17D:
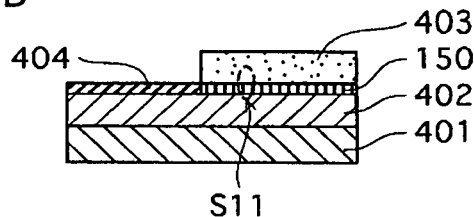
Figure 18A:
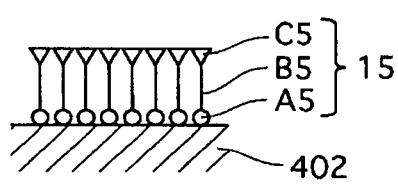
FIGS. 18A and 18B are structural views showing a periphery of a functional organic molecule pertaining to embodiment 7.
Figure 18B:
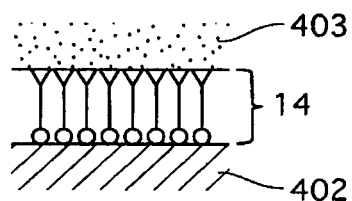

A characteristic feature of the film carrier tape 70 shown in FIG. 17D is that the wiring pattern layer 402 and the solder resist layer 403 have been bonded together using functional organic molecules 15 that include a second functional group C5 having a photopolymerization initiating property or a photosensitive property (enlarged view of S11 in FIG. 18A).

The second functional group C5 is composed of, for example, a compound, chemical structure, or derivate including at least one of a benzophenone, an acetophenone, an alkylphenone, a benzoin, an anthraquinone, a ketal, a thioxanthone, a coumarin, a triazine halide, an oxadiazole halide, an oxime ester, an acridine, an acridone, a fluorenone, a fluorane, an acylphosphine oxide, a metallocene, a polynuclear aromatic, a xanthene, a cyanine, a squalium, an acridone, a titanocene, and a tetra-alkyl thiuram sulfide. Also, the second functional group C5 is not limited to these compounds. Any compound may be applied as long it has a photo-excited polymerization initiating property or a photosensitive property.

Embodiment 7, which uses the functional organic molecules 15 has the same effect as embodiment 6, that is to say, preventing the peeling of the solder resist layer 403 from the wiring pattern layer 402.

Additionally, the application of the solder resist material while exciting a photopolymerization initiating agent quickly hardens the material to form the solder resist layer. This prevents dripping and loss of resin shape, and enables the formation of the solder resist layer 403 with an accurate and precise pattern.

Specifically, the solder resist material paste used in the application step is provided in a fluid state set to a predetermined viscosity. The paste is applied along a pattern mask disposed on the wiring pattern layer 402. The mask is removed after performed predetermined drying, but there is still the possibility of some of the paste spreading after removal of the mask. For this reason, a degree of spreading is assumed, and the paste is applied to an area that is somewhat smaller than the patterning mask. Here, the edges of the paste form acute angles and readily peel off during the plating step.

In contrast, in embodiment 7, the organic coating is exposed to ultraviolet radiation directly before application of the paste, thereby providing the second functional group C5 with light energy (E=hν), which enables causing the paste to harden quickly. This eliminates the formation of acutely angled edges, such as in conventional technology. The paste can be applied accurately to the patterning mask since there is little flow in the paste. This has the benefit of enabling the formation of a solder resist layer with a highly precise shape.

Manufacturing Method

First, the predetermined wiring pattern layer 402 (Cu foil) is formed on the insulation film 401 using a photoetching method or the like.

Next, the organic coating 140 composed of a single-molecule layer is formed by the self-assembly of the functional organic molecules 15 that have been deposited on the wiring pattern layer 402 (FIG. 17B, enlarged view of S10 in FIG. 18A).

Then, the second functional groups C5 of the functional organic molecules 15 in the organic coating 140 are exposed to ultraviolet radiation of a predetermined wavelength (e.g. approximately 340 nm or greater). This moves the second functional groups C5 from their base state to an excited state (E0→E1). The paste material for forming the solder resist layer is applied in a predetermined thickness using a blade BL during a predetermined period in which the excited is maintained (FIG. 17C). Accordingly, the excitation energy of the second functional groups C5 is transferred to the solder resist side as thermal energy, thereby causing thermosetting of the solder resist.

This completes the manufacture of the film carrier tape 40 (FIG. 17D).

Figure 19:
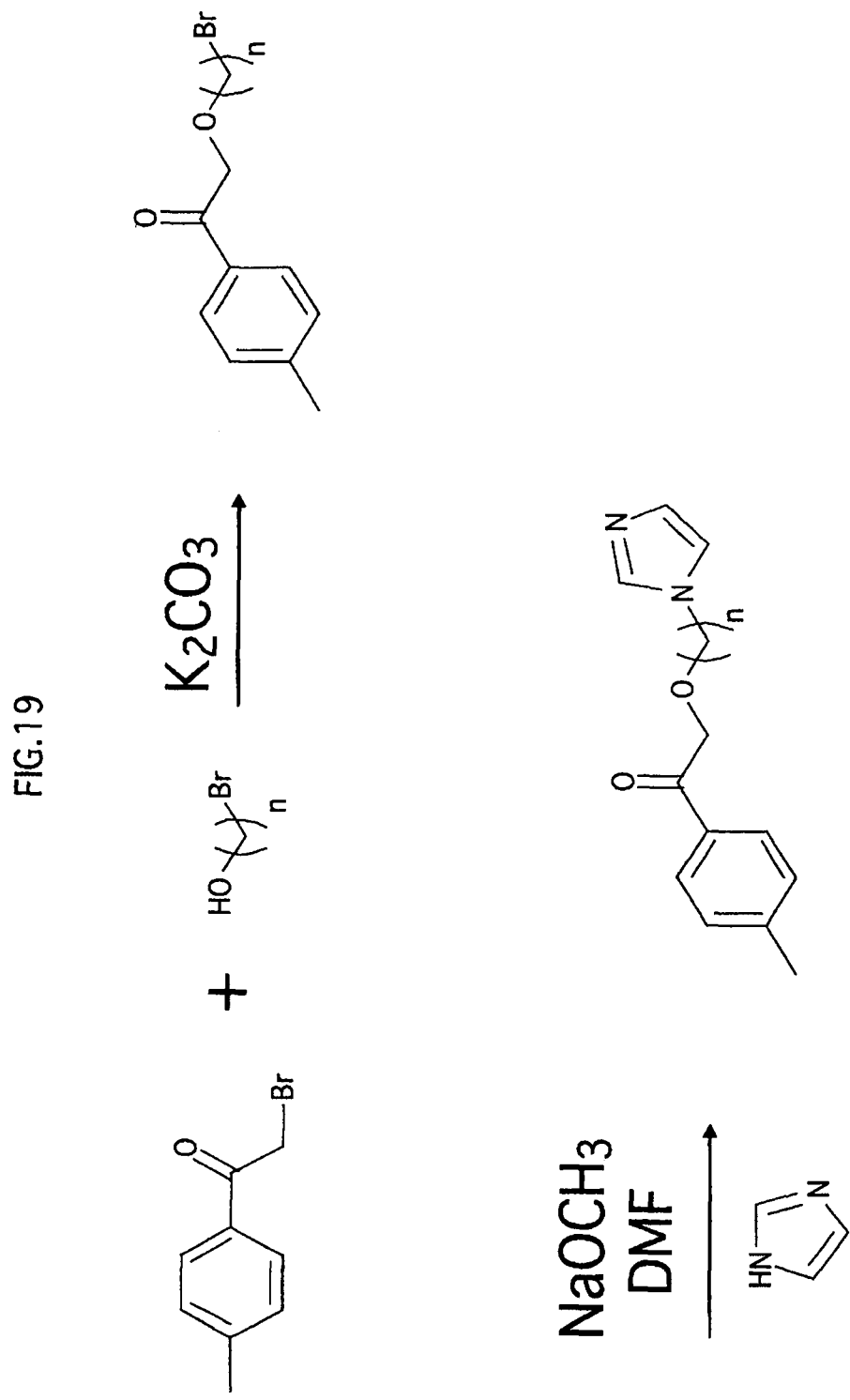
FIG. 19 shows a synthesis reaction process of the functional organic molecule pertaining to embodiment 7.

FIG. 19 shows an exemplary synthesis reaction process of the functional organic molecule of embodiment 7, in which the first functional group A5 is an imidazole, the main chain B5 is a methylene chain, and the second functional group C5 is a methylacetophenone.

Methylacetophenone having bromide at one end is reacted with linear alkane having a hydroxyl at one end and bromide at the other end, in the presence of potassium carbonate, thereby causing an ether bond with the linear alkane due to a hydrobromide elimination reaction of the methylacetophenone. Thereafter, the resulting compound is added to a mixed solvent including DMF and sodium methoxide containing an imidazole, and the functional organic molecules are synthesized by a de-hydrobromidating condensation reaction.

Embodiment 8

The following is a description of embodiment 8 focusing on differences from embodiments 6 and 7.

In embodiment 8, the organic coating is formed on the wiring pattern layer 402 using the functional organic molecules 15 that are the same as in embodiment 2. A characteristic feature of embodiment 8 is that a batch process is used when forming the solder resist layer 403. This has the benefits of, similarly to embodiment 7, strengthening the bond between the solder resist layer 403 and the wiring pattern layer 402, as well as creating a wider range of possible thicknesses for the solder resist layer 403 than when using a general printing method. This enables flexibly responding to modifications in design.

FIGS. 20A to 20E show a manufacturing process for the film carrier tape 40 of embodiment 8.

Figure 20A:
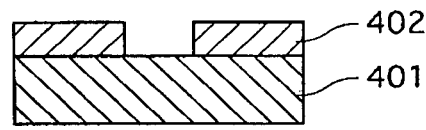
FIGS. 20A to 20E show a manufacturing process for a film carrier tape pertaining to embodiment 8.

First, the wiring pattern layer 402 is formed in a predetermined pattern on the insulation film 401 (FIG. 20A).

Figure 20B:
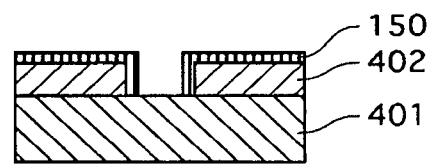

Next, in the organic coating formation step, the organic coating 150 is formed on the surface of the wiring pattern layer 402, thereby obtaining an intermediate product (FIG. 20B). The formation method can be performed in substantially the same way as in embodiment 1.

Then, a resin dispersion fluid is prepared by dispersing a photopolymerizing compound, which is to form the solder resist material, in a solvent. The photopolymerizing compound is a monomer and/or an oligomer such as a compound containing an acrylate group, a methacrylate group, an acrylamide group, a urethane group, an isocyanate group, or a vinyl group.

Figure 20C:
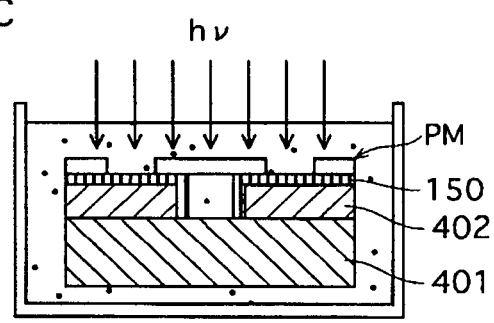

After preparation, the resin dispersion fluid is filled into a batch of a predetermined solution. A pattern mask PM corresponding to an area where the solder resist is to be formed is applied to the intermediate product. The pattern mask PM can be, for example, a photoresist layer formed by heretofore known exposure processing. The intermediate product is immersed in the batch of resin dispersion fluid, and exposed to ultraviolet radiation while keeping the intermediate product in a stable condition in the fluid (FIG. 20C).

This realizes the solder resist layer formation step. Specifically, the photopolymerizing compound dispersed in the fluid polymerizes around the second functional groups C5, which are photopolymerization initiating agents, in the vicinity of the organic coating 50 in the apertures of the pattern mask PM (or in pattern gaps if a photoresist layer is used). Given that progression of the polymerization reaction originates at positions nears the second functional groups C5, a solder resist layer 403 with a single-molecule thickness can be formed by making the ultraviolet radiation exposure time very short. Also, making the ultraviolet radiation exposure time longer theoretically causes the formation of a solder resist layer with a thickness corresponding to the depth of the second functional groups C5. This method enables the adjustment of the solder resist layer 403 to an arbitrary thickness.

Note that the thickness of the solder resist layer 403 can be controlled not only according to the ultraviolet radiation exposure time, but also by adjusting the concentration of compounds in the dispersion fluid.

Figure 20D:
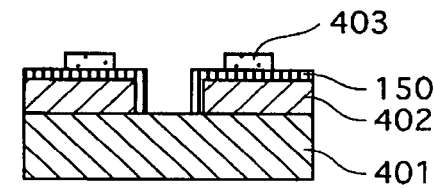

After the ultraviolet radiation hardening reaction, the intermediate product is removed from the batch, the mask is removed, and appropriate cleaning is performed (FIG. 20D).

Figure 20E:
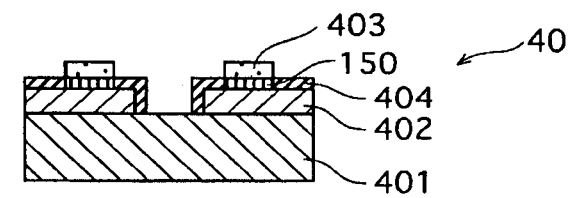
Figure 21A:
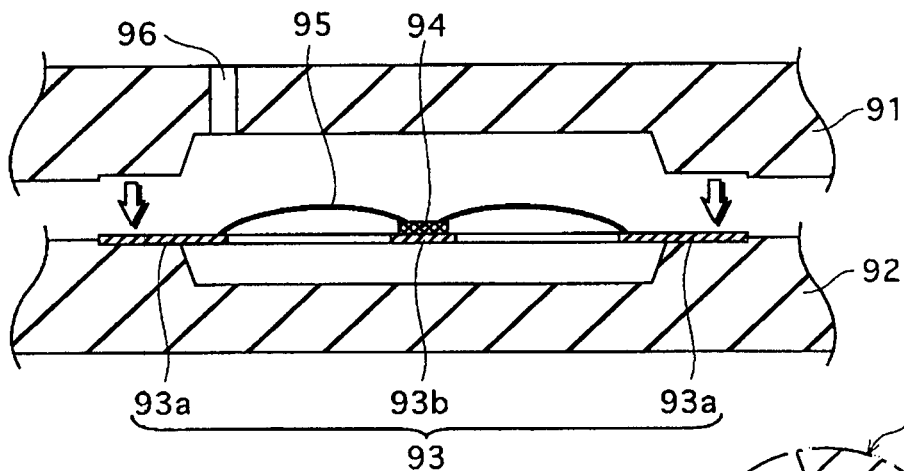
FIGS. 21A to 21D shows steps during conventional injection molding of a semiconductor device.
Figure 21B:
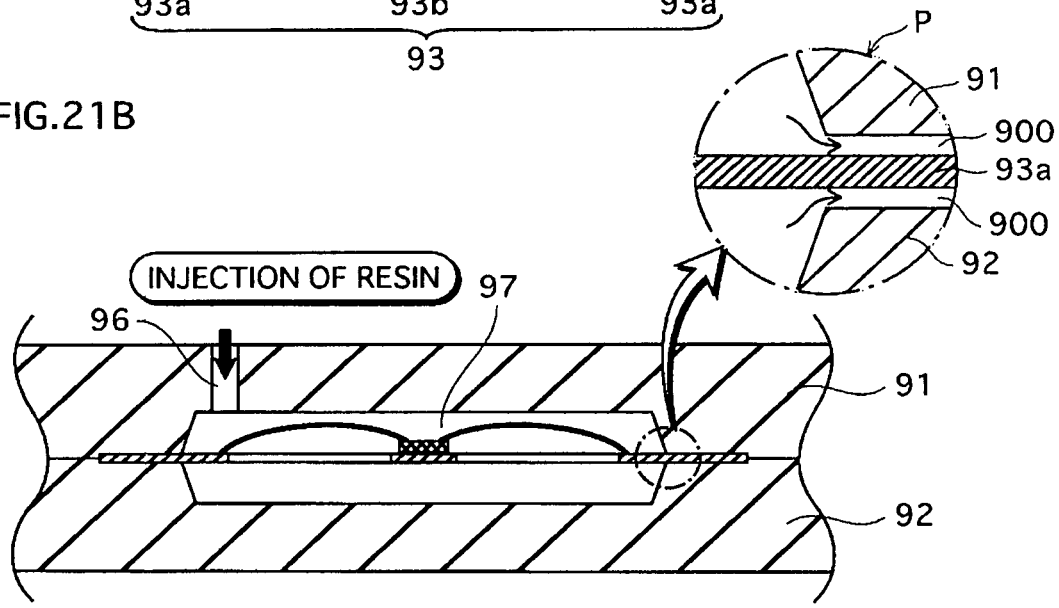
Figure 21C:
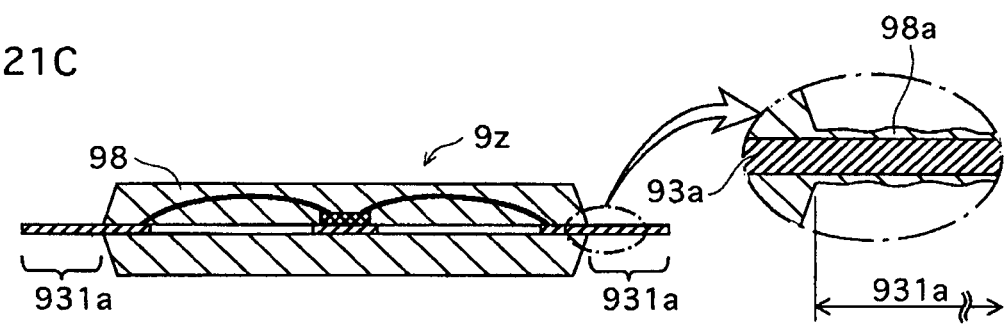
Figure 21D:
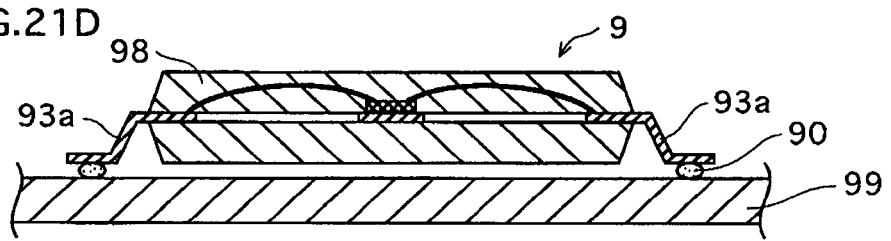

Thereafter, the organic coating 150 is removed from areas other than below the solder resist layer 403, and the Sn plating layer 404 is formed (FIG. 20E).

This completes the manufacture of the film carrier tape 40.

According to this manufacturing method, the solder resist material is buoyant due to the difference in specific gravity from the dispersion fluid, thereby enabling the formation of the solder resist layer 403 on the organic coating 150 without a loss of shape due to gravity. This has the benefit of enabling freely forming a thick-film or thin-film solder resist layer 403 with precision of shape and thickness.

Note that it is preferable to adjust the specific gravity of the dispersion fluid such that the photopolymerizing compound favorably disperses therein for a predetermined time period. Furthermore, if the specific gravity of the dispersion fluid is adjusted such that the photopolymerizing compound gradually settles, it is possible to prevent unnecessary limitations on the reaction rate due to localized shortages of the photopolymerizing compound.

Other Remarks

Although the organic coating is constituted from a single-molecule film by self-assembling functional organic molecules in the above-described embodiments, the organic coating may be multilayered as long as there is no degradation in the degree of adhesion to the substrate etc. of the semiconductor device.

In this case, a bonding property is required for the second functional groups and first functional groups of adjacent molecules between a first layer and a second layer composed of the functional organic molecules. In other words, it is necessary for the first functional group to be a compound or structure that has a metal bonding property for the wiring lead, die pad, etc., as well as a bonding property for the second functional group.

The present invention can applied to a film carrier tape used in a semiconductor device such as an IC, LSI, or VLSI that is packaged in a resin sealing, in an LED device implementing an LED element used in an LED lighting apparatus etc., in a flexible substrate, or the like.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A wiring member including a wiring lead composed of a metallic material, wherein
an organic coating has been formed on a surface of the wiring lead by self-assembly of a plurality of functional organic molecules,
each of the functional organic molecules has a chemical structure including a main chain having two ends, a first functional group bonded to one end of the main chain, and a second functional group bonded to the other end of the main chain, the first functional group being in a form for bonding to the wiring lead by any one or more of a metal bond, a hydrogen bond, and a coordinate bond by a metal complex, and the second functional group having a resin hardening property or a resin-hardening promoting property,
the main chain includes at least one of a methylene chain, a fluoromethylene chain and a siloxane chain, which have a carbon number n of 4 to 40, the main chain being hydrophobic,
an outermost layer of the wiring lead includes Ag,
each of the first functional groups is bonded to the wiring lead,
the first functional group is a chemical structure selected from the group consisting of (i) a nitrogen-containing heterocyclic compound, (ii) a nitrogen-containing heterocyclic compound and a thiol compound, (iii) a nitrogen-containing heterocyclic compound and a sulfide compound, and (iv) a nitrogen-containing heterocyclic compound, a thiol compound, and a sulfide compound, the nitrogen-containing heterocyclic compound of (i), (ii), (iii) and (iv) being selected from the group consisting of an imidazole compound and a triazine compound, and
the second functional group is (v) a chemical structure selected from the group consisting of a hydroxyl, a carboxylic acid, an acid anhydride, a primary amine, an amide, a thiol, a sulfide, a hydrazide, an organic phosphine, and a boron trifluoride amine complex, (vi) a chemical structure selected from the group consisting of a vinyl and an organic hydrogen silane, (vii) a chemical structure selected from the group consisting of platinum, palladium, ruthenium, and rhodium, or (viii) a chemical structure selected from the group consisting of a fluorescent compound and a phosphorescent compound.

2. A resin-coated metal part including the wiring member of claim 1 having a resin material adhered to a portion thereof, wherein
a deposited area of the organic coating is greater in area than a surface area of the wiring member where the resin has been adhered.

3. The resin-coated metal part of claim 2, wherein the resin is a thermoset resin.

4. The resin-coated metal part of claim 3, wherein
the thermoset resin is composed of a compound, a chemical structure, or a derivative that includes at least one selected from the group consisting of an epoxy resin, a phenol resin, an acryl resin, a melamine resin, a urea resin, an unsaturated polyester resin, an alkyl resin, a polyimide resin, a polyamide resin, and a polyether resin, and
the second functional group is composed of a compound, a chemical structure, or a derivative that includes at least one selected from the group consisting of a secondary amine and a tertiary amine.

5. The resin-coated metal part of claim 3, wherein the thermoset resin is a silicone resin.

6. A resin-sealed semiconductor device comprising:
a wiring member including a wiring lead composed of a metallic material,
an organic coating having been formed on a surface of the wiring lead by self-assembly of a plurality of functional organic molecules,
each of the functional organic molecules having a chemical structure including a main chain having two ends, a first functional group bonded to one end of the main chain, and a second functional group bonded to the other end of the main chain, the first functional group being in a form for bonding to the wiring lead by any one or more of a metal bond, a hydrogen bond, and a coordinate bond by a metal complex, and the second functional group having a resin hardening property or a resin-hardening promoting property,
each of the first functional groups having bonded to the wiring lead; and
a semiconductor element electrically connected to the wiring lead, wherein
a portion of the wiring member is externally exposed,
the semiconductor element has been resin sealed in an area where the organic coating has been formed,
the main chain includes at least one of a methylene chain, a fluoromethylene chain and a siloxane chain, which have a carbon number n of 4 to 40, the main chain being hydrophobic,
an outermost layer of the wiring lead includes Ag,
the first functional group is a chemical structure selected from the group consisting of (i) a nitrogen-containing heterocyclic compound, (ii) a nitrogen-containing heterocyclic compound and a thiol compound, (iii) a nitrogen-containing heterocyclic compound and a sulfide compound, and (iv) a nitrogen-containing heterocyclic compound, a thiol compound, and a sulfide compound, the nitrogen-containing heterocyclic compound of (i), (ii), (iii) and (iv) being selected from the group consisting of an imidazole compound and a triazine compound, and
the second functional group is (v) a chemical structure selected from the group consisting of a hydroxyl, a carboxylic acid, an acid anhydride, a primary amine, an amide, a thiol, a sulfide, a hydrazide, an organic phosphine, and a boron trifluoride amine complex, (vi) a chemical structure selected from the group consisting of a vinyl and an organic hydrogen silane, (vii) a chemical structure selected from the group consisting of platinum, palladium, ruthenium, and rhodium, or (viii) a chemical structure selected from the group consisting of a fluorescent compound and a phosphorescent compound.

* * * * *